(12) United States Patent
Bolstad et al.

(10) Patent No.: US 10,367,674 B2
(45) Date of Patent: Jul. 30, 2019

(54) METHODS AND APPARATUS FOR ARRAY-BASED COMPRESSED SENSING

(71) Applicant: Massachusetts Institute of Technology, Cambridge, MA (US)

(72) Inventors: Andrew K. Bolstad, Arlington, MA (US); Jonathan D. Chisum, South Bend, IN (US); James E. Vian, Westford, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 15/811,905

(22) Filed: Nov. 14, 2017

(65) Prior Publication Data

US 2018/0083816 A1   Mar. 22, 2018

Related U.S. Application Data

(63) Continuation of application No. PCT/US2016/032320, filed on May 13, 2016.

(60) Provisional application No. 62/161,916, filed on May 15, 2015.

(51) Int. Cl.

| | |
|---|---|
| H04L 1/02 | (2006.01) |
| H04L 27/26 | (2006.01) |
| G01S 3/74 | (2006.01) |
| H01Q 21/00 | (2006.01) |
| H04B 1/00 | (2006.01) |

(Continued)

(52) U.S. Cl.
CPC ............ *H04L 27/265* (2013.01); *G01S 3/74* (2013.01); *H01Q 21/0025* (2013.01); *H04B 1/0025* (2013.01); *H04B 7/0617* (2013.01); *H04L 27/0002* (2013.01)

(58) Field of Classification Search
CPC ..... H04L 1/0618; H04L 1/06; H04L 27/2647; H04B 7/0417; H04B 1/123
USPC .......... 375/267, 260, 324, 349, 350; 341/50, 341/110; 455/132, 140
See application file for complete search history.

(56) References Cited

U.S. PATENT DOCUMENTS

| | | | |
|---|---|---|---|
| 6,385,262 B1 * | 5/2002 | Gustafsson | ............ H04B 1/005 375/350 |
| 7,012,556 B2 | 3/2006 | Dean et al. | |
| 7,599,451 B2 | 10/2009 | May | |

(Continued)

OTHER PUBLICATIONS

Candés, E. J. et al., "Robust uncertainty principles: exact signal reconstruction from highly incomplete frequency information," IEEE Transactions on Information Theory, vol. 52, No. 2, pp. 489-509, 2006. [Online]. Available: http://dx.doi.org/10.1109/TIT.2005.862083.

(Continued)

*Primary Examiner* — Khai Tran
(74) *Attorney, Agent, or Firm* — Smith Baluch LLP

(57) ABSTRACT

An array-based Compressed sensing Receiver Architecture (ACRA) includes an antenna array with two or more antennas connected to two or more ADCs that are clocked at two or more different sampling rates below the Nyquist rate of the incident signals. Comparison of the individual aliased outputs of the ADCs allows for estimation of signal component characteristics, including signal bandwidth, center frequency, and direction-of-arrival (DoA). Multiple digital signal processing (DSP) techniques, such as sparse fast Fourier transform (sFFT), can be employed depending on the type of detection or estimation.

32 Claims, 20 Drawing Sheets

(51) Int. Cl.
  *H04B 7/06* (2006.01)
  *H04L 27/00* (2006.01)

(56) References Cited

U.S. PATENT DOCUMENTS

| | | | |
|---|---|---|---|
| 8,090,037 | B1 | 1/2012 | Harris et al. |
| 8,254,481 | B1 | 8/2012 | McCloskey et al. |
| 8,743,914 | B1 | 6/2014 | Jensen |
| 9,313,072 | B2 | 4/2016 | Katabi et al. |
| 9,544,167 | B2 | 1/2017 | Katabi et al. |
| 2009/0239551 | A1 | 9/2009 | Woodsum |
| 2014/0177748 | A1* | 6/2014 | Malaga ............ H04B 1/0014 375/267 |

OTHER PUBLICATIONS

Donoho, D. L., "Compressed sensing," IEEE Transactions on Information Theory, vol. 52, No. 4, pp. 1289-1306, 2006. [Online]. Available: http://dx.doi.org/10.1109/TIT.2006.871582.

Duarte, M. et al., "Single-pixel imaging via compressive sampling," IEEE Signal Processing Magazine, vol. 25, No. 2, pp. 83-91, Mar. 2008.

Gilbert, A. et al., "Recent developments in the sparse fourier transform: A compressed fourier transform for big data," Signal Processing Magazine, IEEE, vol. 31, No. 5, pp. 91-100, Sep. 2014.

Hassanieh, H. et al., "Bigband: Ghz-wide sensing and decoding on commodity radios," MIT CSAIL, Cambridge, MA, Tech. Rep. MIT-CSAIL-TR-2013-009, May 2013. [Online]. Available: http://hdl.handle.net/1721.1/79058.

Hassanieh, H. et al., "Simple and practical algorithm for sparse fourier transform," in Proceedings of the Twenty-third Annual ACM-SIAM Symposium on Discrete Algorithms, ser. SODA '12. SIAM, 2012, pp. 1183-1194. [Online]. Available: http://dl.acm.org/citation.cfm?id=2095116.2095209.

International Search Report and Written Opinion dated Aug. 19, 2016 for International Application No. PCT/US2016/032320, 8 pages.

Krieger, J. et al., "Design and analysis of multicoset arrays," in Acoustics, Speech and Signal Processing (ICASSP), 2013 IEEE International Conference on, May 2013, pp. 3781-3785.

Laska, J. et al., "Random sampling for analog-to-information conversion of wideband signals," in IEEE Dallas Circuits and Systems Workshop (DCAS), 2006, 4 pages.

Mishali, M. et al., "From theory to practice: Sub-Nyquist sampling of sparse wideband analog signals," J. Sel. Topics Signal Processing, vol. 4, No. 2, pp. 375-391, 2010. [Online]. Available: http://dx.doi.org/10.1109/JSTSP.2010.2042414.

Murray, T. et al., "Design of a CMOS A2I data converter: Theory, architecture and implementation," in Information Sciences and Systems (CISS), 2011 45th Annual Conference on, Mar. 2011, pp. 1-6.

Romero, C. et al., "Compressive covariance sensing: Structure-based compressive sensing beyond sparsity," Signal Processing Magazine, IEEE, vol. 33, No. 1, pp. 78-93, Jan. 2016.

Trakimas, M. et al., "A compressed sensing analog-to-information converter with edge-triggered SAR ADC core," in 2012 IEEE International Symposium on Circuits and Systems, ISCAS 2012, Seoul, Korea (South), May 20-23, 2012, 2012, pp. 3162-3165. [Online]. Available: http://dx.doi.org/10.1109/ISCAS.2012.6271993.

* cited by examiner

METHODS AND APPARATUS FOR ARRAY-BASED COMPRESSED SENSING

CROSS-REFERENCES TO RELATED APPLICATIONS

This application is a bypass continuation of International Application No. PCT/US2016/032320, filed May 13, 2016, and entitled "Methods and Apparatus for Array-Based Compressed Sensing," which in turn claims priority, under 35 U.S.C. 119(e), to U.S. Application No. 62/161,916, filed May 15, 2015, entitled "Methods and Apparatus for Array-Based Compressed Sensing." Each of these applications is hereby incorporated herein by reference in its entirety.

GOVERNMENT SUPPORT

This invention was made with Government support under Contract No. FA8721-05-C-0002 awarded by the U.S. Air Force. The Government has certain rights in the invention.

BACKGROUND

The rising popularity of wireless communication and the potential of a spectrum shortage motivated the United States Federal Communications Commission (FCC) to take steps towards releasing multiple new spectral bands and re-purposing some under-used spectral bands for dynamic spectrum sharing. Currently, actual utilization of the spectrum is sparse, with large swaths of spectrum in the gigahertz (GHz) range remaining underutilized. Dynamic sharing can more efficiently use these spectral bands by making these bands accessible to many different types of wireless services. For example, multiple ultra-wideband links can share the same wideband spectrum by using orthogonal time-hopping codes for time-modulated systems, or orthogonal pulses and orthogonal codes for fast-pulse-based systems.

There is also increasing demand for spectral sensing systems capable of identifying, locating, and responding to electromagnetic emissions found anywhere in extremely wide bandwidths (e.g., tens of GHz). Existing systems usually rely on sequential hopping from one relatively small portion of the spectrum (e.g., a "channel" or "band") to another relatively small portion of the spectrum, typically covering only tens of MHz at a time. Therefore, only a small band in a much wider overall spectrum is monitored each time, making it easy to miss short lived signals (e.g., radar pulses or burst transmissions) in a given band of a wider swath of GHz spectrum.

In addition, on small platforms, it is desirable to reduce the size, weight, and power (SWAP) of the spectral sensing systems. Current systems typically use one or more instantaneous frequency measurement (IFM) receivers to detect signals and cue a more precise receiver or digital receiver array. Unfortunately, IFM receivers tend to be bulky and power consuming. For example, the Teledyne DR024-F2 IFM provides 2-18 GHz coverage with 3.93 MHz frequency resolution and consumes 18.5 Watts of power. Alternatives to IFMs include channelized receivers, direct digital receivers, and compressive receivers. Channelization is a relatively high SWAP alternative involving distribution of multiple local oscillator signals and large filter banks. Direct digital converters capable of converting more than about 2 GHz rely on interleaved analog-to-digital converters (ADCs) with low effective number of bits (ENOB) due to jitter. Compressive receivers provide very good performance, but still add SWAP to the overall system.

SUMMARY

Embodiments of the present invention include apparatus, systems, and methods of detecting spectrum using array-based compressing sensing techniques. In one example, an apparatus for sensing an incident signal includes an antenna array to receive the incident signal. The antenna array includes a first antenna and a second antenna. The apparatus also includes a first analog-to-digital converter (ADC), communicatively coupled to the first antenna, to generate a first aliased signal by sampling the incident signal at a first sampling frequency $f_1$ below a Nyquist frequency $f_n$ of the incident signal. The apparatus also includes a second ADC, communicatively coupled to the second antenna, to generate a second aliased signal by sampling the incident signal at a second sampling frequency $f_2$, different than the first sampling frequency $f_1$, below the Nyquist frequency $f_n$ of the incident signal. A processing system is communicatively coupled to the first ADC and the second ADC to compute a spectrum of the incident signal based at least in part on the first aliased signal and the second aliased signal.

In another example, a method for sensing an incident signal includes receiving the incident signal with an antenna array comprising a first antenna and a second antenna. The incident signal received by the first antenna is sampled at a first sampling frequency $f_1$ below a Nyquist frequency $f_n$ of the incident signal to generate a first aliased signal. The incident signal received by the second antenna is sampled at a second sampling frequency $f_2$, different than the first sampling frequency $f_1$, below the Nyquist frequency $f_n$ of the incident signal to generate a second aliased signal. The method also includes computing a spectrum of the incident signal based at least in part on the first aliased signal and the second aliased signal.

In yet another example, an apparatus for sensing an incident signal includes a first sensing channel, a second sensing channel, and a processing system. The first sensing channel includes a first antenna to receive the incident signal. A first in-phase channel is operably coupled to the first antenna to receive a first in-phase component of the incident signal. The first in-phase channel includes a first in-phase ADC to sample the first in-phase component at a first sampling frequency $f_1$ below a Nyquist frequency $f_n$ of the incident signal to generate a first sampled in-phase signal. A first quadrature channel is also operably coupled to the first antenna to receive a first quadrature component of the incident signal. The first quadrature channel includes a first quadrature ADC to sample the first quadrature component at the first sampling frequency $f_1$ to generate a first sampled quadrature signal. The second sensing channel includes a second antenna to receive the incident signal. A second in-phase channel is operably coupled to the second antenna to receive a second in-phase component of the incident signal. The second in-phase channel includes a second in-phase ADC to sample the second in-phase component at a second sampling frequency $f_2$ below the Nyquist frequency $f_n$ of the incident signal to generate a second sampled in-phase signal. A second quadrature channel is operably coupled to the second antenna to receive a second quadrature component of the incident signal. The second quadrature channel includes a second quadrature ADC to sample the second quadrature component at the second sampling frequency $f_2$ to generate a second sampled quadrature signal. The processing system is communicatively coupled to the first sensing channel and the second sensing channel to compute frequency information and direction information of the incident signal based at least in part on the first sampled in-phase signal, the first sampled quadrature signal, the second sampled in-phase signal, and the second sampled quadrature signal.

In yet another example, a method for sensing an incident signal includes receiving the incident signal with an antenna array comprising a first antenna and a second antenna. The incident signal received by the first antenna is sampled at a first sampling frequency $f_1$ below a Nyquist frequency $f_n$ of the incident signal to generate a first aliased signal. The incident signal received by the second antenna is sampled at a second sampling frequency $f_2$ below the Nyquist frequency $f_n$ of the incident signal to generate a second aliased signal. The downsampling factors defined by $p_1=f_n/f_1$ and $p_2=f_n/f_2$ are co-prime integers. The method also includes generating a first spectral-domain signal from the first aliased signal. The first spectral-domain signal has a first spectral-domain folding of the incident signal. The method also includes generating a second spectral-domain signal from the second aliased signal. The second spectral-domain signal has a second spectral-domain folding of the incident signal different than the first spectral-domain folding. The first spectral-domain signal and the second spectral-domain signal are combined based on the first sampling frequency $f_1$ and the second sampling frequency $f_2$ to form a spectrum of the incident signal. A direction-of-arrival of the incident signal is determined based on the phases of the spectral-domain signals.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Overview

Figure 1A:
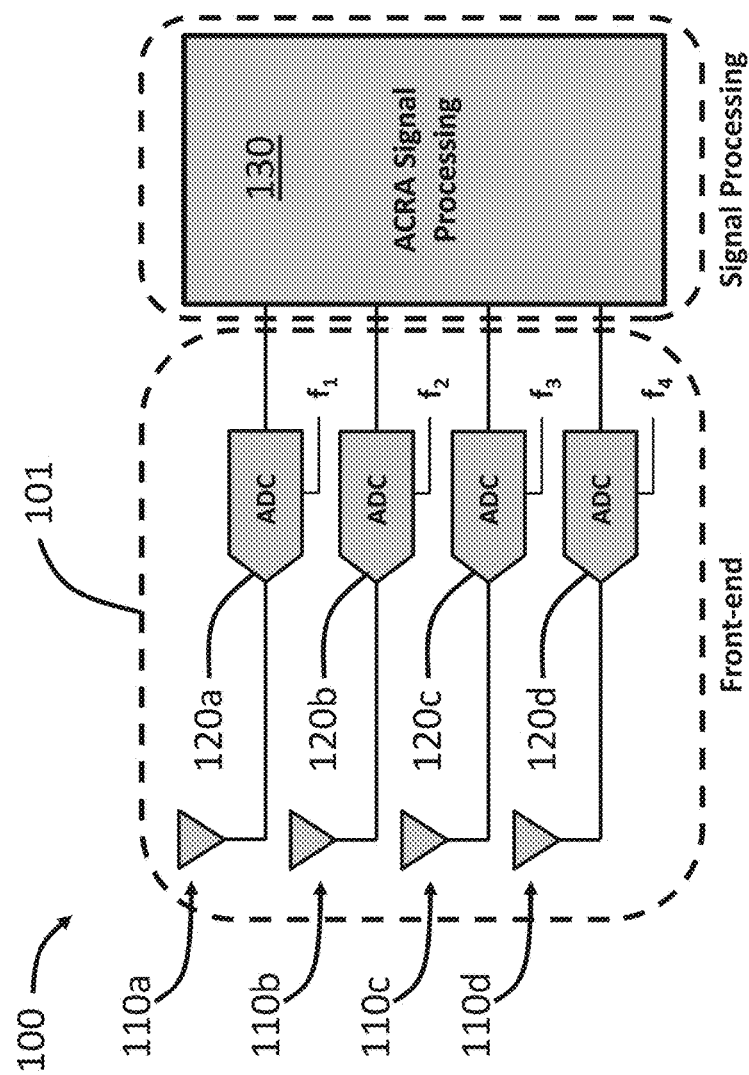
FIG. 1A shows a schematic of a spectral sensing apparatus using array-based compressed sensing techniques.

Fully digital phased array receivers typically operate over instantaneous bandwidths which are much less than their tuning bandwidths due to limitations in ADC sampling rates or data processing capability. The local oscillator frequency is set using either a cueing receiver or prior knowledge of the band of interest. While tuned to a particular frequency band, such an array may not demodulate, decode, or determine the angle-of-arrival (AoA) of signals in different bands. In theory Compressed Sensing (CS) can extend instantaneous bandwidth beyond Nyquist rate limitations. However, receivers using CS techniques typically make significant changes to front-end RF hardware. Furthermore, CS signal reconstruction algorithms can be computationally demanding. The related sparse Fourier transform algorithms aim to reduce the processing time necessary to compute the DFT of frequency-sparse signals. In particular, the sparse fast Fourier transform (sFFT) achieves processing time better than the ubiquitous FFTW for long, frequency sparse signals using only a small subset of the available data.

The sFFT operates on a length-N signal by subsampling (modulo N) by L different integer factors producing L data streams. A window function applied to each data stream can significantly reduce the number of samples actually used. This compressed set of measurements contains L versions of the original signal, each experiencing a different pattern of aliasing. The sFFT resolves the ambiguity present in any single data stream by combining all L versions of the aliased signal in a voting procedure.

The subsampling step of the sFFT can take place in the analog-to-digital conversion step of an RF receiver by using L different ADCs, each operating at a different sub-Nyquist sampling rate. Along these lines, the "BigBand" receiver replaces a single high cost, power hungry Nyquist rate ADC with several low rate, low power ADCs to sample the signal from a single antenna. Taking advantage of the $N_r$ ADCs already available in a fully digital receiver array with $N_r$ antenna elements, these ADCs can be operated at $L \leq N_r$ different sampling rates. The digital data acquired from each element can then be processed as prescribed by the sFFT to recover the frequency support of sparse spectral signals. Furthermore, the sFFT can be modified to leverage the spatial diversity of the array, providing AoA capability as well as a coherent estimate of the signal.

Consider a typical digital phased array receiver with $N_r$ elements operating over a tuning bandwidth of $W_t$ with an instantaneous bandwidth of $W_i$. In each channel of the array, mixers down-convert a narrowband signal of interest centered at $f_c$ to an intermediate frequency (IF) or to DC ("zero IF") where the signal is filtered to bandwidth $W_i$ to reduce noise and avoid aliasing. Following another down-conversion when appropriate, the signal is sampled at the Nyquist rate of $2W_i$ (or $W_i$ if IQ sampling is used). Array processing techniques are then applied to the samples collected from each channel to form beams pointed in particular directions. While digital arrays allow beams to be formed in several directions simultaneously, received signals may need to lie within the $W_i$ Hertz band set by the LO frequency.

ACRA drastically expands the bandwidth via sFFT-inspired signal processing. Rather than tuning the receiver to $f_c$ and filtering the signal to bandwidth $W_i$, ACRA sets the LO to the center of the tuning band and passes the entire tuning band with bandwidth $W_t$ to the ADCs in each channel. The ADCs in each array channel are clocked at different sub-Nyquist rates, allowing each channel to digitize a different aliased version of the signal. These downsampled versions of the wideband signal play the role of the downsampled data streams in the sFFT.

ACRA uses aliasing of tuning bandwidths that can be significantly wider than typical instantaneous bandwidths. This can be a challenge for many existing high speed ADCs ($\geq 1$ GSPS), which are not designed to alias several Nyquist zones having input bandwidths typically between fs and 2fs. At the chip level, this limitation can be addressed by designing ADCs with input bandwidths matching $W_t$. At the component level, a wideband track-and-hold amplifier (THA) can be added directly before the ADC in each channel to increase the input bandwidth of the ADC. The THA can effectively take on the sampling role, while the ADC acts as a quantizer. In ACRA, the front-end hardware is configured to accommodate the downsampling and aliasing necessary for the sFFT. Modifications to the sFFT are also helpful to estimate AoA.

sFFT typically does not use the delay (given by $\tau$) between the start of different downsampled data streams to determine the frequency support of the signal. This delay can be used in the estimation step to undo the different phase shifts occurring in each set of downsampled data. In other words, detection of frequency support uses a form of incoherent combining, while estimation uses coherent combining. In a receiver array, AoA information resides in the relative phase offsets of signals from different channels, making it necessary to coherently combine signals from each antenna to estimate AoA. If the signals impinging on the array occupy a sparse set of frequencies, then the location step of the sFFT can be used to determine frequency support and the estimation step can be augmented with phase adjustments corresponding to different putative angles of arrival and antenna locations. If the signals impinging on the array are not sufficiently frequency-sparse, but are sparse in frequency-angle space, incorporating AoA estimation into the voting step may be more appropriate. This can be accomplished by coherently combining estimates from each antenna. Thus:

$$s_{k,\theta,\varphi} = \left| \sum_{l=1}^{L} \frac{Z_{h\sigma_l}(k) e^{j\frac{2\pi}{N}k(\tau_l + \zeta_l(\theta,\phi))}}{W_{o\sigma_l}(k)} 1_{|Z_{h\sigma_l}(k)| \geq T_h} \right|$$

where $\zeta_l(\theta, \varphi)$ is the time delay at antenna 1 due to its position in the array for a signal impinging on the array at angle $(\theta, \varphi)$ and $1_E$ is the indicator function for event E. If $s_{k,\theta,\varphi}$ is greater than a threshold, a detection is declared for a signal at frequency k and angle $(\theta, \varphi)$.

Using coherent combining in the voting step replaces the integer random variable Si in conventional spectral sensing with a continuous random variable $s_{k,\theta,\varphi}$ related to the strength of the signal. This can have a profound effect on the dynamic range of detectable signals. In the incoherent case (e.g., voting), the dynamic range can be limited by the noise present in each channel. Under coherent combining, the dynamic range can be limited to $20 \log_{10} N_r$ dB unless an iterative version of the sFFT is used. Thus, signals which are sparse in frequency-angle space, but not sufficiently sparse in frequency alone, may take additional computation to maintain high dynamic range.

The Array-based Compressed sensing Receiver Architecture (ACRA) can detect bursty signals with lower size, weight, power, and cost than conventional receivers. An ACRA can include an antenna array and signal processing architecture that can capture very wide bandwidths with low rate analog-to-digital converters (ADCs). An ACRA includes an antenna array with two or more antennas connected to two or more ADCs which are clocked at different sampling rates, each of which is below the Nyquist rate of the incident signals. Subsets of the antennas may be combined to form subarrays, each of which is connected to a single ADC, resulting in two or more sub-arrays connected to two or more ADCs sampled at two or more different sampling rates.

The detection band of interest can be directly sampled from the antennas (e.g., using sample-and-hold and/or ADC circuit technology that supports the desired bandwidths) or can be down-converted prior to sampling. The sampling rates of the ADCs are less than the Nyquist sampling rate for the detection band resulting in a many-to-one mapping of the wider detection band to the narrower ADC Nyquist band, i.e., spectral folding or aliasing. The outputs from the ADCs may have aliased copies of some signal components that vary depending on the sample rates of the ADCs. Comparing the individual aliased outputs of the ADCs allows for estimation of signal component characteristics, including signal bandwidth, center frequency, direction-of-arrival (DoA), magnitude and phase across antennas, signal classification (e.g. symbol rate), and full signal reconstruction for decoding. Multiple digital signal processing (DSP) techniques can be employed depending on the type of detection or estimation.

DSP techniques that can be used to estimate these quantities include the sparse fast Fourier transform (sFFT) and other sparse Fourier transform algorithms, matching pursuit style algorithms, least absolute shrinkage and selection operator (LASSO) style algorithms including the elastic net, linear programming, second order cone programming, other compressed sensing (CS) detection and estimation algorithms, conventional and adaptive beamforming, and k means and other clustering algorithms, among others. In addition, combinations of the above methods (e.g., incorporating sparse spectrum estimation, spatial processing, and one dimensional information extraction) can also be employed to further improve the performance of spectrum sensing.

Figure 5:
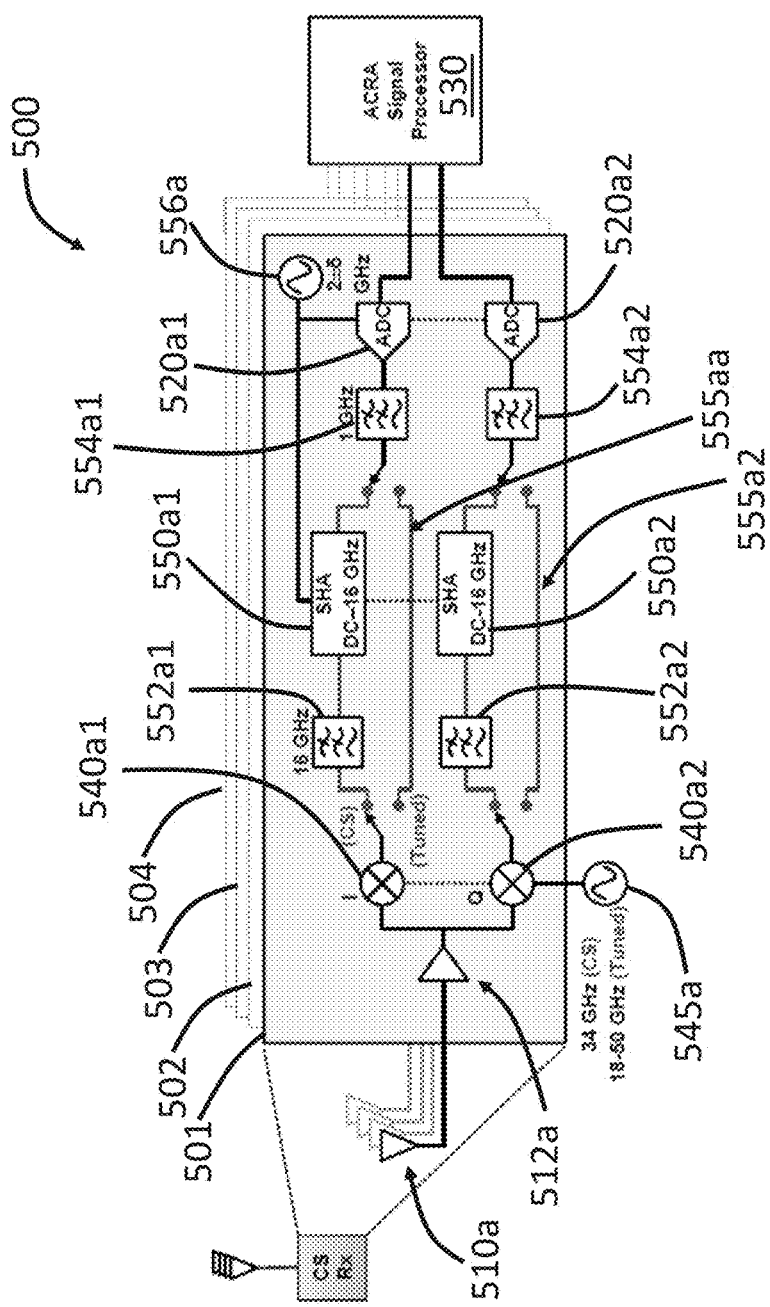
FIG. 5 shows a schematic of a spectral sensing system including stacked sensing channels.

Some useful aspects of ACRA include, but are not limited to: (1) CS architecture for antenna arrays, (2) the reuse of hardware for a CS mode and a Tuned mode as seen in FIG. 5, (3) the alternate signal path which increases the input bandwidth (blue path if FIG. 5), (4) the use of multiple sampling rates across the array, (5) the combination of detecting signals' frequency support and angles-of-arrival, and (6) distributed CS processing across the array.

ARCA can achieve wideband sensing with antenna arrays in a power efficient, low cost manner by using low bandwidth components, which are typically cheaper, to cover a much wider spectrum. ACRA can also perform persistent surveillance of the spectrum for unused frequency bands while supporting spatial reuse through the array's beam-steering capability, thereby increasing the likelihood of detecting short bursts of RF energy and reducing the delay in detecting persistent waveforms with little to no increase in size, weight, power, cost, or computational complexity compared to typical receiver arrays.

With the above advantages, ACRA can be used for commercial and military scenarios where wideband spectrum sensing is desired. Military applications include radar and electronic warfare (EW) systems, whereas commercial applications include base station transceivers and mobile handsets. Potential commercial entities that could benefit from this technology include base station and handset manufacturers, fixed wireless service providers (e.g., Carlson Wireless Technologies RuralConnect TV White Space radio system), device providers for the unlicensed secondary user market, and Department of Defense contractors.

Systems of Array-Based Compressed Sensing

FIG. 1A shows a schematic of an apparatus 100 using array-based compressed sensing. The apparatus 100 includes a front end 101 and a processing system 130. The front end 101 further includes four antennas 110a, 110b, 110c, and 110d (collectively referred to as antennas 110) to receive incident signals that may contain spectral components covering a broad bandwidth (e.g., greater than 1 GHz, also referred to as wideband signals). Each antenna 110a to 110d is coupled to a respective analog-to-digital converter (ADC) 120a to 120d (collectively referred to as ADCs 120), which samples the signals received by each antenna 110a to 110d at sampling frequencies $f_1$ to $f_4$ below the Nyquist frequency $f_n$ of the incident signals (also referred to as sub-sampling). For purposes of the present disclosure, a "sample" of a signal refers to a complex sample including both in-phase I and quadrature Q components (thus, the Nyquist criterion implies that a bandwidth of interest of BW Hz requires BW complex samples per second, i.e., real and imaginary samples).

The output signals of the four ADCs 120a to 120d are transmitted to the processing system 130, which computes the spectral information of the incident signals. Since four antennas 110a to 110d are used in the apparatus 100 to form an array, the processing system 130 can also extract spatial information, including angle-of-arrival (AoA), from the incident signals. The processing system 130 can include a generic processor, a cluster of parallel computers, field-programmable gate arrays (FPGAs), and/or application-specific integrated circuits (ASICs).

Signal sub-sampling can allow for smaller-sized FFTs, but one tradeoff is that signal sub-sampling in the time domain may give rise to a concept referred to as "frequency collision" in the frequency domain. Using multiple ADCs with different co-prime downsampling factors to sample the incident signals can mitigate "frequency collision" that may arise from sub-sampling in the time domain. Accordingly, the apparatus 100 may employ co-prime sub-sampling techniques for the ADCs 120 to facilitate "collision resolution."

Figure 1B:
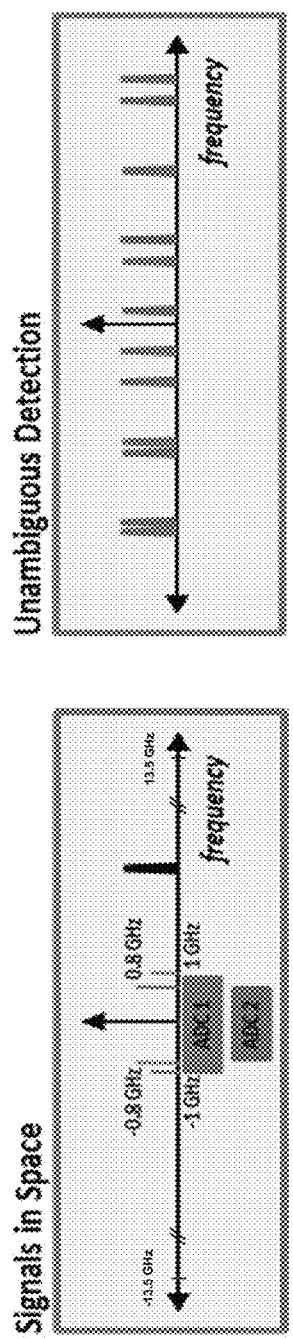
FIG. 1B illustrate the unfolding of detected frequencies for the apparatus shown in FIG. 1A.

FIG. 1B illustrate one method of collision resolution for the apparatus 100. Each receiver unfolds element-level detection across its aliased Nyquist zones and casts a "vote" for those frequency bins. Array-level detection is declared if enough receiver elements vote for the same frequency bin. This approach is a mapping of the recently-developed SFFT to hardware. More information about SFFTs and collision resolution can be found in U.S. Pat. No. 9,313,072, which is hereby incorporated herein by reference in its entirety.

In one example, the four antennas 110 can form a phased array, in which the spacing between antennas is less than half-wavelength of the incident signals, to derive spatial information about the incident signals. In another example, the four antennas 110 can form a sparse array with greater than half-wavelength spacing between antennas. In yet another example, the spacing between antennas 110 can be non-uniform. Sparse arrays can provide a wider aperture for finer spatial resolution.

The highest sampling frequency (e.g., $f_1$) and the lowest sampling frequency (e.g., $f_4$) can have various ratios. In one example, the ratio between $f_1$ and $f_4$ can be substantially equal to or greater than 2. In another example, the ratio between $f_1$ and $f_4$ can be less than 2. For example, the sampling frequencies can be within the range of about 1.3 GHz to about 2 GHz.

The sampling frequencies $f_1$ to $f_4$ can be related to each other by co-prime integers. Using $f_1$ and $f_2$ as an example for illustration, $f_1$ can be written as $f_1=f_n/p_1$ and $f_2$ can be written as $f_2=f_n/p_2$, where $f_n$ is the Nyquist frequency of the incident signals and $p_1$ and $p_2$ are co-prime integer numbers. In one example, the integers $p_1$ and $p_2$ can be greater than 2 (e.g., $p_1=2$, $p_2=3$; $p_1=3$, $p_2=5$; $p_1=5$, $p_2=7$; etc.). In another example, the integers $p_1$ and $p_2$ can be greater than 10 (e.g., $p_1=11$, $p_2=13$; $p_1=13$, $p_2=15$; $p_1=15$, $p_2=17$; etc.).

The integer numbers $p_1$ and $p_2$ can also depend on the maximum sampling frequency of the ADCs 120 and the highest spectral frequency of interest in the incident signals. The ADCs 120 can be commercially available ADCs having a maximum sampling frequency $f_m$. The incident signals can have a highest frequency of interest $F_m$. In this case, the integer numbers $p_1$ and $p_2$ can be greater than $F_m/f_m$.

Figure 2:
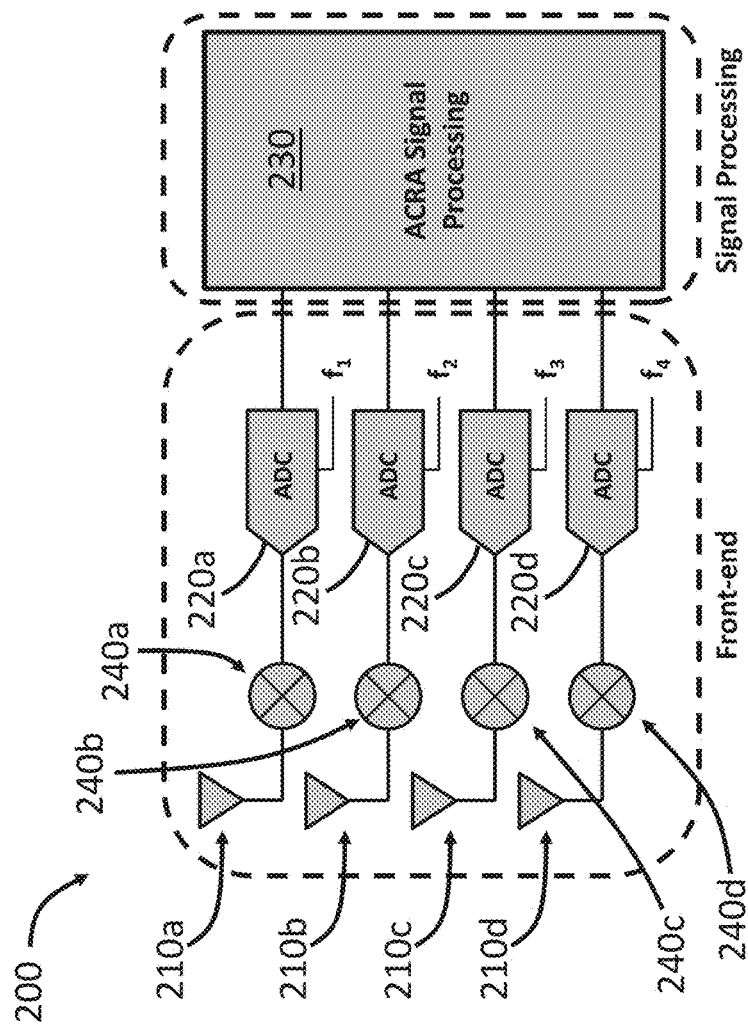
FIG. 2 shows a schematic of a spectral sensing system including down converters.

The apparatus 100 shown in FIG. 1A uses four antennas 110, four ADCs 120, and four different sampling frequencies $f_1$ to $f_4$ for illustrative purposes. In practice, other numbers of antennas, ADCs, and different sampling frequencies can also be used. Generally, a larger number of distinct sampling frequencies can reduce the chance of missing detection of spectral components in the incident signals. On the other hand, the cost of the resulting apparatus can be higher if more distinct sampling frequencies are used. The number of distinct sampling frequencies can also depend on the sparsity of the incident signals, i.e., less distinct sampling frequencies can be used for more sparse signals. In one example, the apparatus 100 can include two ADCs 120 at two distinct sampling frequencies. In another example, the apparatus 100 can include more than four ADCs 120 at more than four distinct sampling frequencies. FIG. 2 shows a schematic of a spectral sensing apparatus 200 that down converts the incident signals to lower frequencies before sampling. The apparatus 200 includes four antennas 210a, 210b, 210c, and 210d to receive incident signals. Signals received by each antenna (210a to 210d) are transmitted to corresponding down converter (240a to 240d) before being transmitted to a corresponding ADC 220a to 220d for sub-sampling. Generally, down conversion can be used to bring the incident signals into a band where the ADCs 220 and/or track and hold amplifiers can operate more effectively. Sampled signals generated by the ADCs 220 are sent to a processing system 230 to compute the spectral information of the incident signals.

In one example, the down converters 240 down convert the incident signals to zero for IQ sampling. In another example, the down converters 240 down convert the incident signals to $(f_{max}-f_{min})/2$ for non-IQ sampling, where $f_{max}$ and $f_{min}$ are the maximum and minimum frequencies of interest in the incident signals.

ACRA uses aliasing of tuning bandwidths (i.e., dynamic range of frequencies that can be detected by ACRA) which can be significantly wider than typical instantaneous bandwidths used in industry. This can be a challenge for many existing high speed ADCs (≥1 GSPS), which are not designed to alias several Nyquist zones (e.g., having input bandwidths on the order of 10 GHz to 40 GHz). At the chip level, this limitation can be addressed by designing ADCs with input bandwidths matching the tuning bandwidth. At the component level, a wideband track-and-hold amplifier (THA) can be added directly before the ADC in each channel to increase the input bandwidth of the ADC. The THA effectively takes on the sampling role, while the ADC acts as a quantizer.

Figure 3:
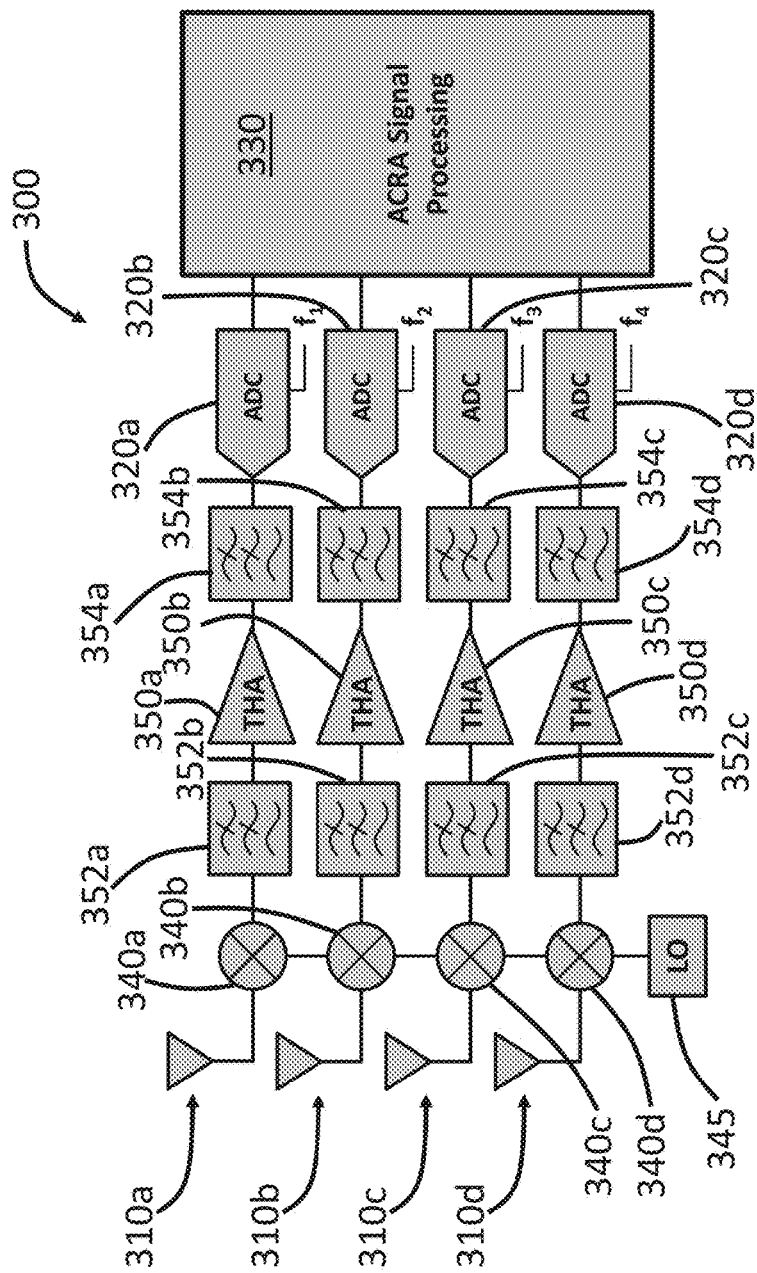
FIG. 3 shows a schematic of a spectral sensing system including track-and-hold amplifiers.

FIG. 3 shows a schematic of a spectral sensing system 300 using THAs, which are also referred to as sample-and-hold amplifiers (SHAs), to increase the operation bandwidth of the ADCs. The system 300 includes four antennas 310a, 310b, 310c, and 310d to receive incident signals. Signals received by each antenna 310a to 310d are transmitted to a corresponding down converter 340a to 340d for down conversion. The four down converters 340a to 340d are connected to a local oscillator 345 that provides common timing information for the down converters 340a to 340d. The down converted signals from the down converters 340a to 340d are sent to four filters 352a to 352d to reduce noise. Four THAs 350a to 350d receive the filtered signals from the filters 352a to 352d to create intermediary signals that are filtered again by another group of filters 354a to 354d before propagating to four ADCs 320a to 320d for sub-sampling. Sub-sampled signals generated by the ADCs 320a to 320d are processed by a processing system 330 to compute spectral, spatial, and/or timing information about the original incident signals received by the four antennas 310a to 310d.

Various bandwidths can be used for the THAs 350a to 350d depending on, for example, the bandwidth of the incident signals. In one example, the THAs 350a to 350d can have a bandwidth of about 18 GHz. In another example, the bandwidth of the THAs 350a to 350d can be increased to 25 GHz. In general, the THA input bandwidth can match the bandwidth of the wide band of interest; i.e. it can be greater than $(f_{max}-f_{min})/2$ if IQ sampling is used or $(f_{max}-f_{min})$ if real valued samples are used, assuming appropriate down conversion in both cases. A THA is usually used when the ADC input bandwidth does not meet this criterion.

Figure 4:
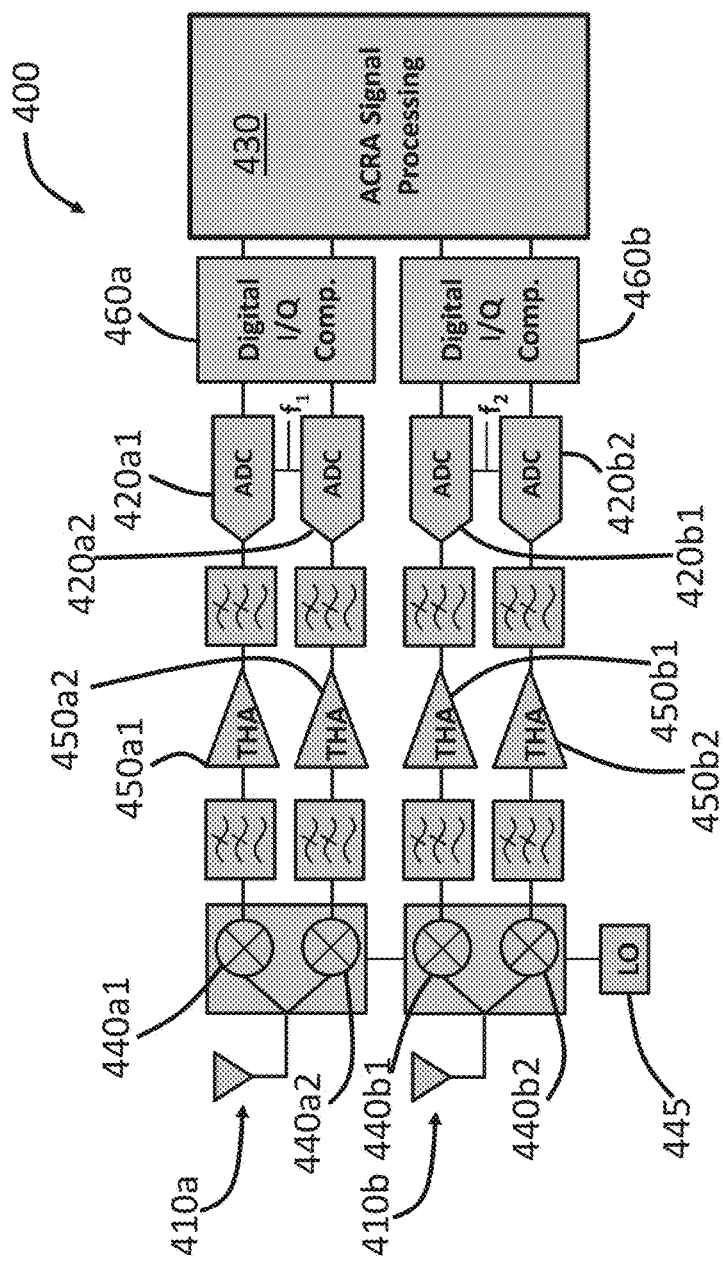
FIG. 4 shows a schematic of a spectral sensing system including in-phase and quadrature sampling and compensation.

FIG. 4 shows a schematic of a spectral sensing system 400 including sampling of both in-phase and quadrature components (i.e., IQ sampling) of incident signals. The system 400 includes two antennas 410a and 410b to receive incident signals. The signals received by antenna 410a are then directed to two down converters 440a1 and 440a2 for down conversion of the in-phase and quadrature components, respectively. Two THAs 450a1 and 450a2 receive the down converted signals to generate intermediary signals that propagate into two ADCs 420a1 and 420a2 for sub-sampling at a sampling frequency $f_1$ below the Nyquist frequency $f_n$ of the incident signals. The sub-sampled signals after the ADCs 420a1 and 420a2 enter a digital IQ compensator 460a to balance the in-phase and quadrature components, which a processing system 430 uses to compute the spectral information. The signals received by the second antenna 420a undergo similar processing, including down conversion by two down converters 440b1 and 440b2 for the in-phase and quadrature components, sampling and holding by two THAs 450b1 and 450b2, sub-sampling by two ADCs 420b1 and 420b2 at another sub-Nyquist frequency $f_2$, IQ compensation by another IQ compensator 460b, and spectral information computation by the processing system 430. A local oscillator 445 is connected to all the four down converters 440a1, 440a2, 440b1, and 440b2 for the down conversion.

The IQ compensators 460a and 460b can be optional in practice, i.e., the system 400 may perform IQ sampling but not IQ compensation. In addition, the system 400 can further include optional filters (not labeled) before and after the four THAs 450a1, 450a2, 450b1, and 450b2 to reduce noise in the signals.

The different ADCs 420a1, 420a2, 420b1, and 420b2 in the system 400 shown in FIG. 4 are arranged on the same plane for illustrative purposes. In practice, different ADCs can also be stacked vertically, or in any other configuration, for example, to achieve certain form factors.

FIG. 5 shows a schematic of a spectral sensing system 500 in which different sensing channels are stacked vertically. The system 500 includes four different sensing channels 501, 502, 503, and 504. The first sensing channel includes an antenna 510a and an amplifier 512a to amplify the signal received by the antenna 510a. Two down converters 540a1 and 540a2 then down convert the in-phase and quadrature components, respectively, of the amplified signals. A local oscillator 545a provides a local oscillator signal for the two down converters 540a1 and 540a2. The down converted in-phase component is transmitted to a filter 552a1 for noise reduction, after which the in-phase component is transmitted through a SHA 550a1 and another filter 554a1. An ADC 520a1 sub-samples the in-phase component to generate a sub-sampled in-phase component for a processing system 530 to compute spectral information. Another local oscillator 556a provides another local oscillator signal for the SHA 550a1 and the ADC 520a1. The down-converted quadrature component is processed in a similar manner, including filtering by a filter 552a2, sampling and holding by another SHA 550a2, more filtering by another filter 554a2, sub-sampling by another ADC 520a2, and spectral computation by the processing system 530. The two ADCs 520a1 and

520a2 can sub-sample the received signals at the same sampling frequency below the Nyquist frequency of the incident signals.

The other three sensing channels 502, 503, and 504 can include similar components as shown in the first sensing channel 501, except that the sub-sampling frequencies of the ADCs in the sensing channels 502 to 504 are different than the sub-sampling frequency used by ADCs 520a1 and 520a2. The four sensing channels 501 to 504 can have four distinct sub-sampling frequencies—one for each channel (pair of ADCs). Any one sub-sampling frequency in the four sub-sampling frequencies can also be co-prime with any other sub-sampling frequency. The four sensing channels 501 to 504, on a chip scale, are stacked vertically to achieve a compact system 500.

The first sensing channel 501 in the system 500 also includes two bypassing routes 555a1 and 555a2 for the down converted signals generated by the two down converters 540a1 and 540a2, respectively. When high resolution signal recovery is desired, ACRA can switch to tuned mode reception, in which down converted signals are transmitted to the bypass routes 555a1 and 555a2 that bypass the wideband SHAs 550a1 and 550a2 and can sample at 2 GSPS across the array with the local oscillator set to the cued frequency.

In one example, the system 500 can use the following parameters. The system 500 can sense signals within the band of about 18 GHz to about 45 GHz. The SHAs 550a1 and 550a2 can have a bandwidth of about 13.5 GHz to alias 27 GHz baseband IQ into a single Nyquist zone, which is digitized by commercial off-the-shelf (COTS) ADCs 520a1 and 520a2. The SHAs 550a1 and 550a2 can extend the ADC input bandwidth, allowing each array element to detect signals in the entire band, albeit with ambiguous frequency support. Resolving this ambiguity can be achieved by clocking the ADCs 520a1 and 520a2 corresponding to different receive elements at different rates (e.g., 1.8±δn GHz) and applying ACRA signal processing.

In another example, the system 500 can use the following components and parameters in implementation. The four sensing channels 501 to 504 can use four sampling rates between 1.58 GHz and 2.00 GHz. The system 500 can achieve 3.91 MHz frequency resolution over more than 27 GHz with −90 dBm sensitivity (probability of false alarm (PFA)≤1e$^{-6}$, probability of detection (PD)≥0.9). For comparison, a wideband cuing receiver based on 2 DR024-F2 ILMs (to achieve 27+ GHz coverage) uses an additional 37 W of power and adds 6.4 lbs of weight. In contrast, addition of the ACRA CS-mode to each of the tuned receiver Radio Frequency Integrated Circuits (RFICs) in a 16-element array provides wideband cuing functionality with only 6.5 W of additional power and negligible size and weight.

Figure 6:
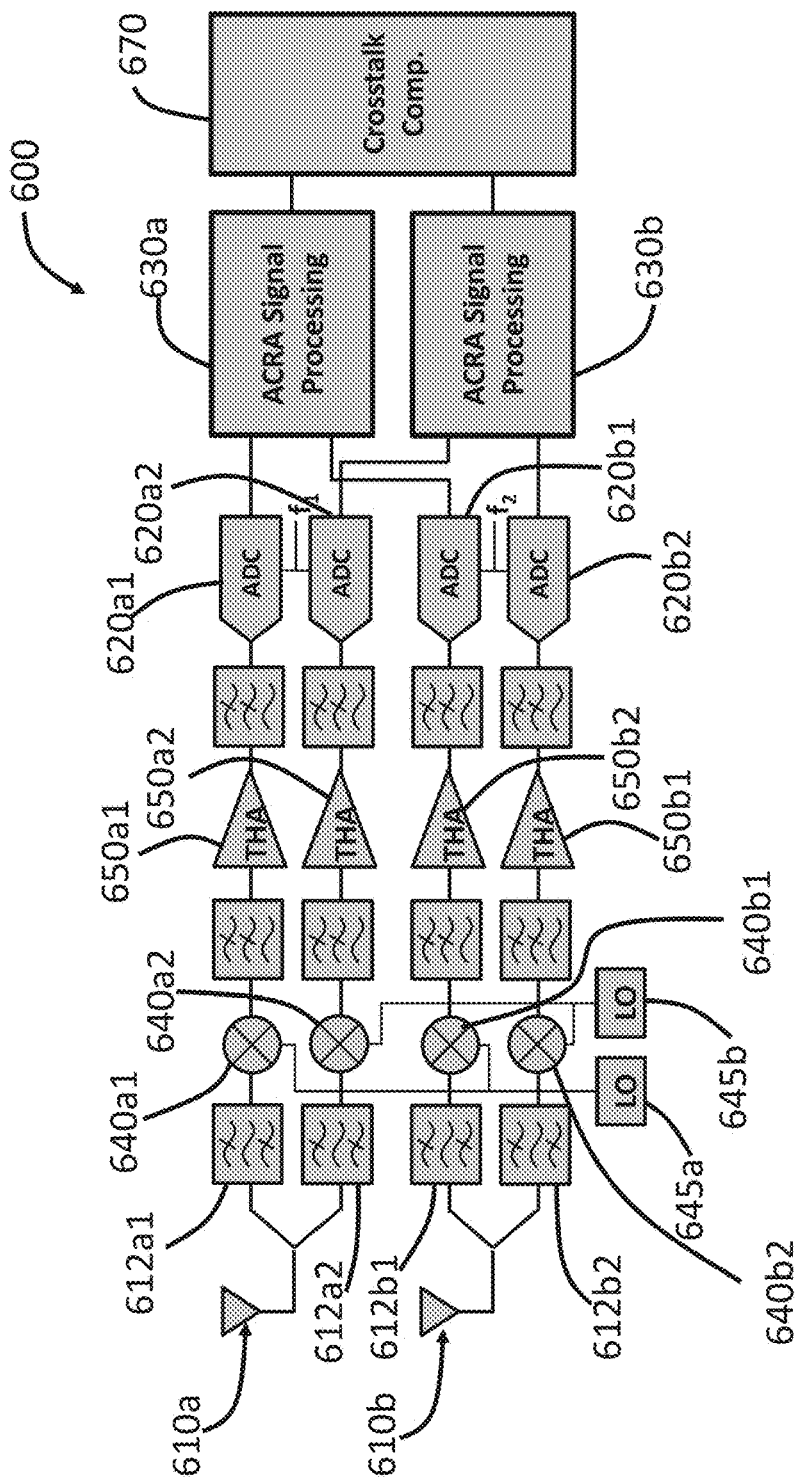
FIG. 6 shows a schematic of a spectral sensing system including frequency channelization and crosstalk compensation.

FIG. 6 shows a schematic of a spectral sensing system 600 with frequency channelization and crosstalk compensation. This configuration can be used to avoid IQ sampling. In this example, two sub-bands (channels) are used, but it is possible to use more. The system 600 includes two antennas 610a and 610b to receive incident signals. The signal received by the first antenna 610a is transmitted to two filters 612a1 and 612a2 to channelize the signal into sub-bands followed by two down converters 640a1 and 640a2 for down conversion. Similarly, the signal received by the second antenna 610b is transmitted to two filters 612b1 and 612b2 to channelize the signal into sub-bands followed by two down converters 640b1 and 640b2 for down conversion. The two down converters 640a1 and 640b1 for down converting the first sub-band share a first local oscillator 645a, and the two down converters 640a2 and 640b2 for down converting the second sub-band share a second local oscillator 645b.

The four down converted signals generated by the down converters 640a1, 640a2, 640b1, and 640b2 undergo similar processing, including filtering, track and holding by THAs (650a1, 650a2, 650b1, and 650b2), and sub-sampling by ADCs (620a1, 620a2, 620b1, and 620b2). The two ADCs 620a1 and 620a2 use a sub-sampling frequency $f_1$ and the other two ADCs 620b1 and 620b2 use a different sub-sampling frequency $f_2$. The first sub-band sub-sampled by the ADCs 620a1 and 620b1 are transmitted to a processor 630a, while the second sub-band sub-sampled by the ADCs 620a2 and 620b2 are transmitted to a quadrature processor 630b. In other words, the two sub-bands are processed separately to derive the spectral information of the incident signals in their respective. A crosstalk compensator 670 is connected to the two processors 630a and 630b to compensate for leakage between the two sub-bands not adequately removed by filters 612a1, 612a2, 612b1, and 612b2.

ACRAs Including Sparse Fast Fourier Transform

As introduced above, the sFFT can be used to process outputs from aliased signals from ADCs at different sub-sampling rates and generate spectral information from the incident signals. Sparse Fourier transforms permit signals whose frequency domain representation is sparse to be recovered using a relatively small subset of signal samples (also referred to herein as "sub-sampling"), such that GHz of spectrum can be effectively analyzed for occupancy by sampling signals representing the wideband spectrum at sampling rates below their Nyquist rate.

Figure 7:
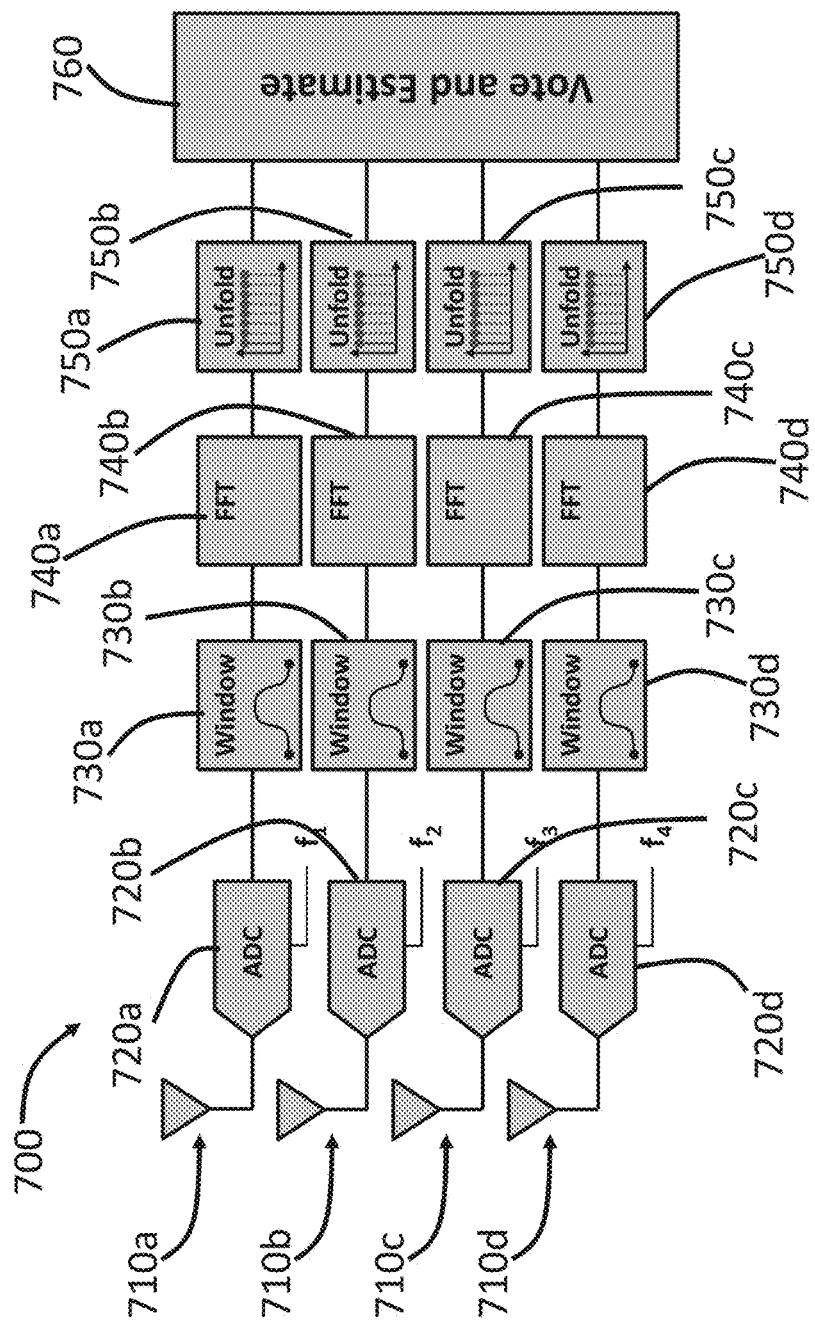
FIG. 7 shows a schematic of a spectral sensing system that uses fast Fourier transforms (FFTs) to compute spectral information.

FIG. 7 shows a schematic of a spectral sensing system 700 using sFFT to estimate spectral information from aliased signals. The system 700 includes four antennas 710a, 710b, 710c, and 710d to receive incident signals. The signals received by the first antenna 710a are sub-sampled by an ADC 720a at a sub-sampling frequency $f_1$ below the Nyquist frequency of the incident signals. The sub-sampled signals are apodized with a window function 730a, which reduces the amplitudes of discontinuities at the boundaries of each finite sequence acquired by the ADC 720a. The window function 730a (also referred to as a windowing process) can include multiplying the sub-sampled signals in temporal domain by a finite-length window with an amplitude that varies smoothly and gradually toward zero at the edges (e.g., a Super-Gaussian curve or Hamming window). The window function 730a can make the endpoints of the waveforms of the sub-sampled signals meet, resulting in a continuous waveform without sharp transitions. The window function 730a can also reduce the number of samples to process and to spread the signal in the frequency domain.

The windowed signals generated by the window function 730a are Fourier transformed by a FFT processor 740a. The output of the FFT processor 740a includes information pertaining to the frequency of each detected frequency component in the incident signals. In one example, the output of the FFT processor 730a includes a frequency index or position for each detected frequency component, and a corresponding complex magnitude and phase of each detected frequency component (also referred to as a "complex value" of a given frequency component). In another example, at least some of the information in the output of the FFT processor 740a pertaining to sensed frequency components may be provided as an N-bit digital word representing the frequency components that are present in the incident signals (e.g., each bit representing whether a respective frequency component is occupied or not). In yet another example, the FFT processor 740a can provide an output having a number of bits equal to $\log_2(N)$ multiplied by a number of the sensed one or more occupied (non-zero) frequency components. In this way, the output represents all the occupied frequencies. In yet another example, as in wireless communication, the occupied frequencies regions can be consecutive, and the FFT processor 740a can use the beginning frequency and the ending frequency of each occupied frequency region to represent the sensed, occupied frequency regions. In this way, the number of output bits equals $2 \times \log_2(N)$ multiplied by a number of occupied frequency regions.

Since the ADC 720a is operating at a sub-sampling rate below the Nyquist rate of the incident signals, the output of the FFT processor 740a also includes aliasing (false frequencies). These false frequencies usually appear as images of the original frequency (also referred to as true frequency) mirrored or folded around the Nyquist frequency.

To extract the original frequency from the mixture of the original frequency and false frequencies, the output of the FFT processor 740a is sent to an unfolding processor 750a, which unfolds each detected signal to its possible source frequencies bins. In other words, a peak in the FFT "unfolds" to several possible source frequencies, one of which is the original frequency while others are false frequencies.

The signals received by the other three antennas 710b to 710d are processed similarly, including sub-sampling by ADCs 720b to 720d, windowing by window functions 730b to 730d, FFT by FFT processors 740b to 740d, and unfolding by unfolding processors 750b to 750d.

The unfolded signals from the four unfolding processors 750a to 750d are sent to a voting and estimation element 760, which estimates the spectral information of the incident signals based on the unfolded frequencies through a voting process. The original frequencies are estimated by counting the votes in the frequency bins cast by the unfolding processors 750a to 750d. For example, if more than a certain number of votes are casted into the frequency bin at 1.5 GHz, then the processor 760 can determine that 1.5 GHz is an original frequency. The voting procedure may use a super-majority standard to determine detection. The exact voting threshold can affects performance and can be tuned for different circumstances.

FIG. 7 shows the window functions 730a to 730d, FFT processor 740a to 740d, unfolding processor 750a to 750d, and the voting and estimation processor 760 as separate elements for illustrative purposes. In practice, these various processors can be integrated into a single processor, which implements windowing, FFT, unfolding, voting, and estimation.

ACRAs Including Beamforming

Figure 8:
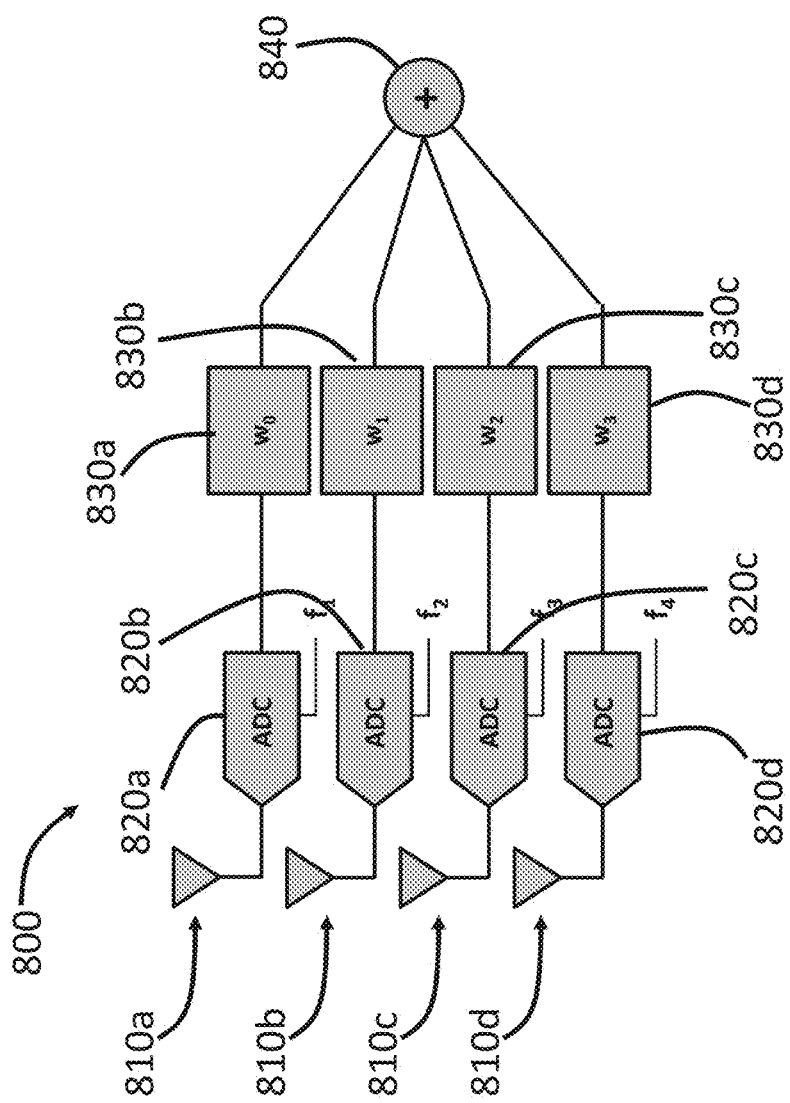
FIG. 8 shows a schematic of a spectral sensing system that performs beamforming.

FIG. 8 shows a schematic of a spectral sensing system 800 that performs beamforming using spatial information contained in signals received by each antenna in an antenna array. The system 800 includes four antennas 810a, 810b, 810c, and 810d to receive incident signals. The signals received by each antenna 810a to 810d are transmitted to a corresponding ADC 820a to 820d for sub-sampling at a corresponding sub-sampling frequency $f_1$ to $f_4$. Each ADC 820a to 820d is connected to a corresponding weight calculator 830a to 830d, which calculates a weight applied to the sub-sampled signals generated by the ADCs 820a to 820d. With these weights, a beamformer 840 can reconstruct the incident signal beam. The weight calculators 830a to 830d and the beamformer 840 are shown in FIG. 8 as separate elements, but they can also be integrated into a single processor that performs weight factor calculation and beamforming. The quality of beamforming can depend on, for example, the arrangement of antennas at the front end of spectral sensing systems.

FIGS. 9A-10B illustrate different configurations of antenna arrays that can be used for beamforming.

Figures 9A, 9B, 9C:
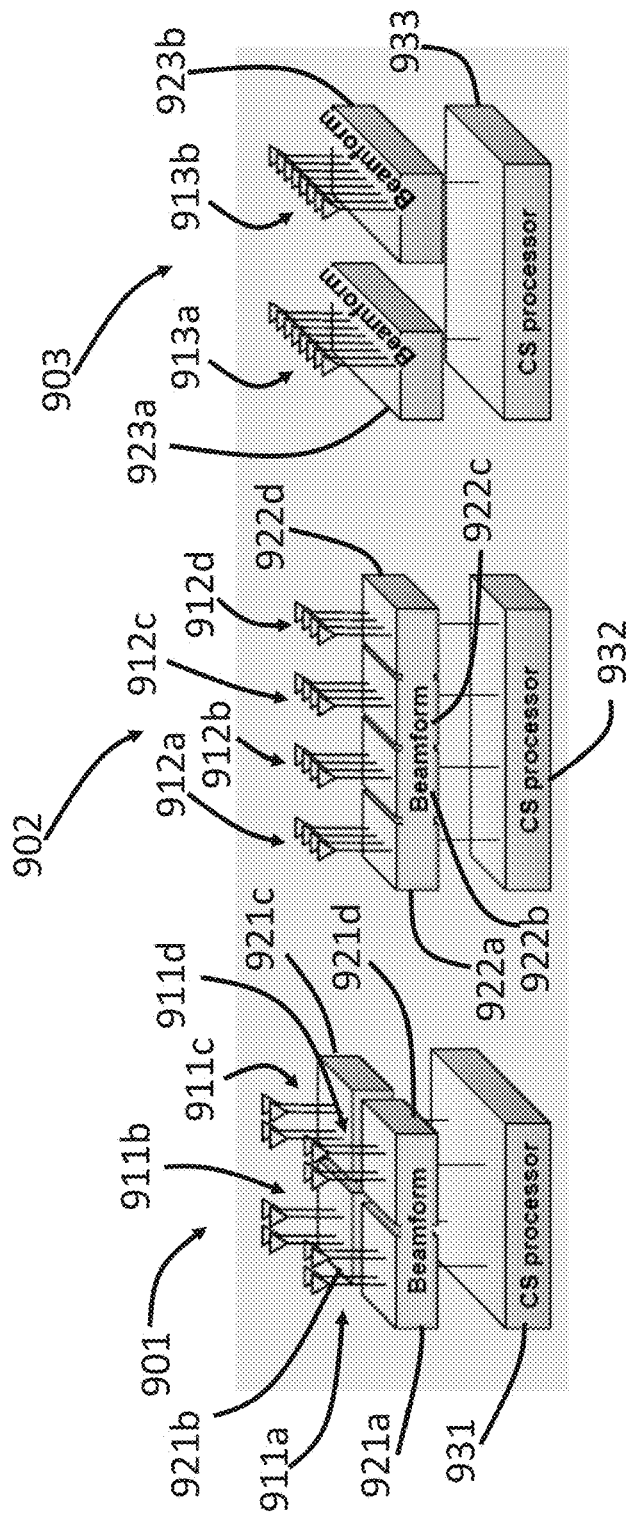
FIGS. 9A-9C shows different sub-array configurations that can be used in the spectral sensing systems shown in FIG. 1A-8.

FIGS. 9A-9C show antenna array configurations including sub-arrays. FIG. 9A shows a configuration 901 including 16 antennas that are grouped into four sub-arrays 911a, 911b, 911c, and 911d. The four sub-arrays 911a to 911d are arranged as a 2×2 array. Signals received by each sub-array 911a to 911d are sampled at a distinct sub-sampling frequency. Each sub-array 911a to 911d is also connected to a corresponding beamformer 921a to 921d to calculate the weight, and a processing system 931 performs compressed sensing methods to reconstruct the spectral information as well as the beamforming of the incident signals.

FIG. 9B shows a configuration 902 including 16 antennas grouped into four sub-arrays 912a, 912b, 912c, and 912d, which are further arranged into a 4×1 array. Similarly, each sub-array 912a to 912d is connected to a corresponding beamformer 922a to 922d, which transmit output signals into a compressed sensing processor 932 to estimate spectrum.

FIG. 9C shows a configuration 903 including 16 antennas grouped into two sub-arrays 913a and 913b, which are further arranged into 2×1 arrays. Similarly, each sub-array 913a and 913b is connected to a corresponding beamformer 923a and 923b, which then transmit output signals into a compressed sensing processor 933 to estimate spectrum. These sub-arrays shown in FIGS. 9A-9C can also be dynamically regrouped into different configurations (e.g., from 4×1 into 2×2) for different implementations.

Among the three configurations 901, 902, and 903, the third configuration 903 can make good angle measurements in azimuth, but may not make measurements in elevation. The compressed sensing may also be limited because only two distinct sampling frequencies are used. In contrast, the first configuration may have limited angle measurement in azimuth and elevation, but CS can be better because four distinct sampling frequencies are used.

Figures 10A, 10B:
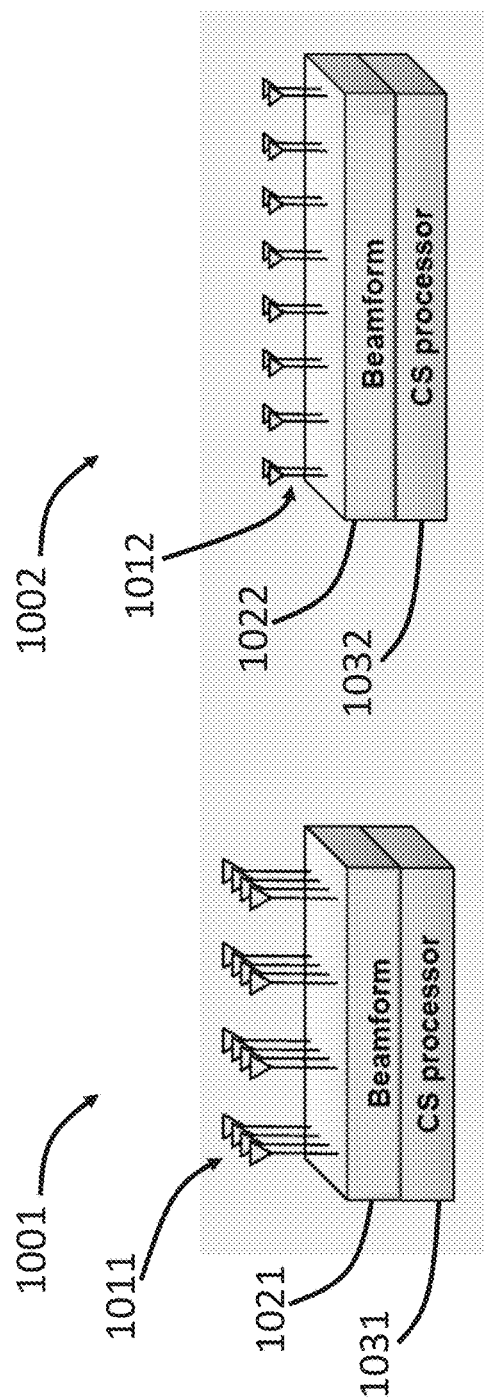
FIGS. 10A-10B shows beamforming using full arrays in the spectral sensing systems shown in FIG. 1A-8.

FIGS. 10A-10B show antenna array configurations without sub-arrays. Signals received by each antenna are sampled at a distinct sampling frequency. FIG. 10A shows a configuration 1001 including 16 antennas 1011 arranged into a 4×4 array. The entire array is connected to a beamformer 1021, which is further connected to a compressed sensing processor 1031. FIG. 10B shows a configuration 1002 including 16 antennas 1012 arranged into a 2×8 array. The entire array is connected to a beamformer 1022, which is further connected to a compressed sensing processor 1032. Between these two configurations 1001 and 1002, the first configuration can make moderate angle measurements in azimuth and elevation, while the second configuration can make limited angle measurements in azimuth and good angle measurements in elevation. Both configurations 1001 and 1002 can have good CS performance.

Figure 11:
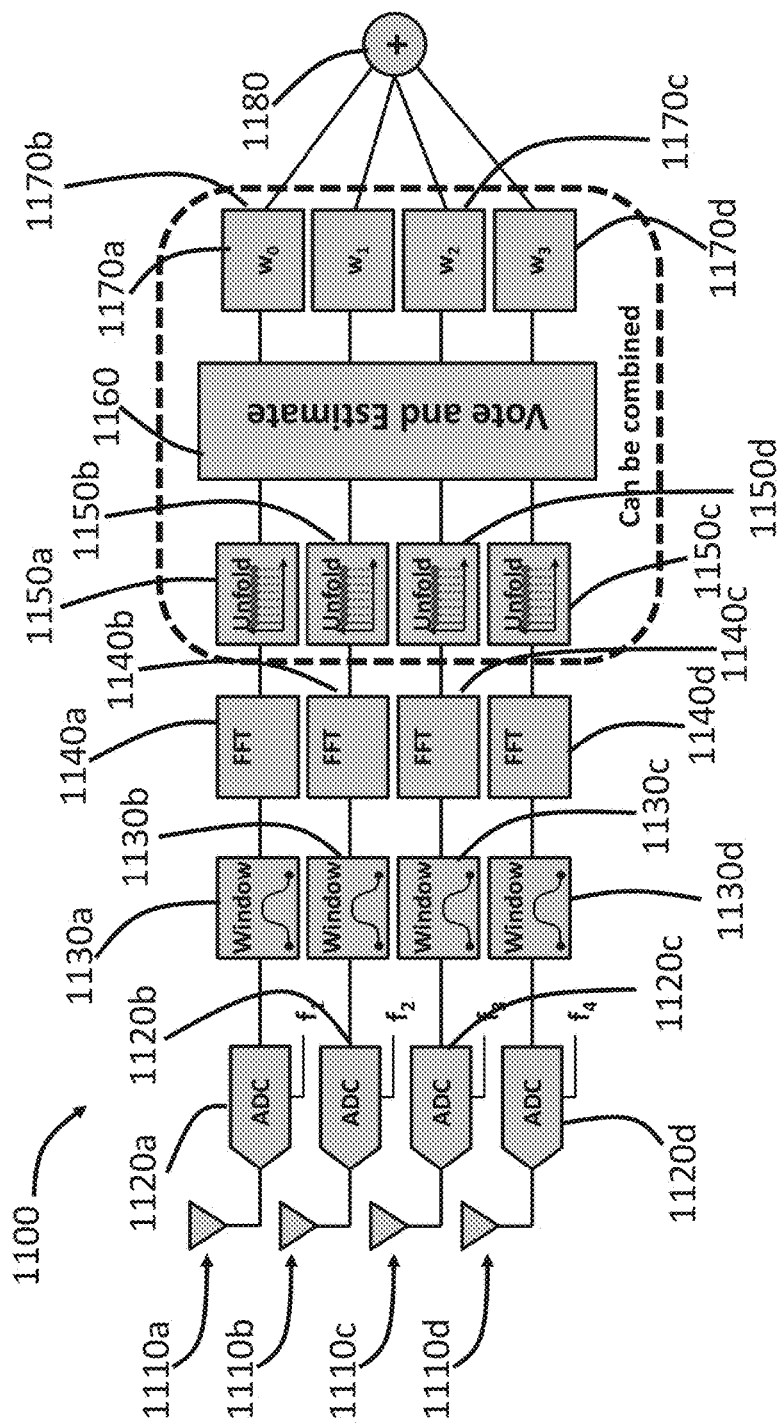
FIG. 11 shows a schematic of a spectral sensing system that uses FFTs for computing spectral information and beamforming.

FIG. 11 shows a schematic of a spectral sensing system 1100 that performs a sparse FFT to determine the central frequency of the incident signals before beamforming. The system 1100 includes four antennas 1110a, 1110b, 1110c, and 1110d to receive incident signals. The signal received by the first antenna 1110a is transmitted into an ADC 1120a for sub-sampling and a window function 1130a applies windowing to the sub-sampled signals before an FFT processor 1140a carries out a Fourier transform to the windowed signals to extract frequency information. An unfolding processor 1150*a* unfolds the Fourier transformed signals generated by the FFT processor 1140*a* to their possible source frequencies bins. Signals received by the other three antennas 111*b* to 1110*d* undergo similar processing, including sub-sampling by ADCs 1120*b* to 1120*d*, windowing by window functions 1130*b* to 1130*d*, Fourier transform by FFT processors 1140*b* to 1140*d*, and unfolding by unfolding processors 1150*b* to 1150*d*.

A voting and estimation processor 1160 collects the unfolded signals generated by the unfolding processors 1150*a* to 1150*d* and determines the frequencies of spectral components in the incident signals. This frequency information can be used by weight calculators 1170*a* to 1170*d* to calculate weights for signals received by each antenna 1110*a* to 1110*d*. A beamformer 1180 then takes into account the calculated weights and reconstructs the incident signal beams.

FIG. 11 shows the unfolding processors 1150*a* to 1150*d*, the voting and estimation processor 1160, and the weight calculators 1170*a* to 1170*d* as separate elements to illustrate the function of the system 1100. In practice, they can either be combined into one processor or use more than one independent processor.

ACRAs Including Clustering

The antenna array used in compressed sensing not only provides spatial information (e.g., angle-of-arrival) of the incident signal, but also allows the use of angle-of-arrival information for clustering. As understood in the art, clustering can convert a general detection problem into several easier detection problems and thereby increase the efficiency of detection.

Figure 12:
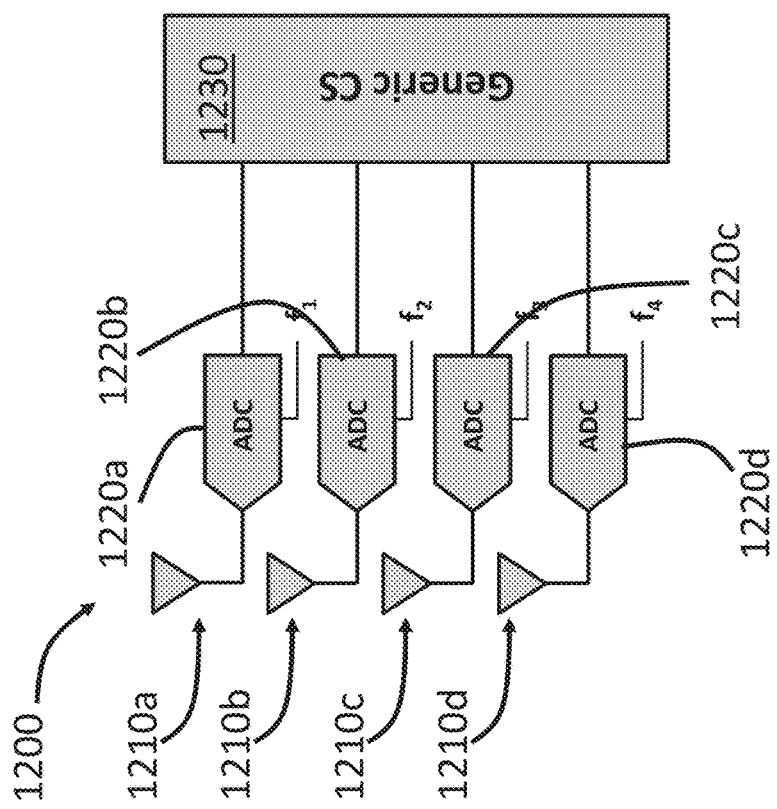
FIG. 12 shows a schematic of a spectral sensing system using compressed sensing (CS) techniques to compute spectral information.

FIG. 12 shows a schematic of a spectral sensing system 1200 using generic clustering techniques. The system 1200 includes four antennas 1210*a*, 1210*b*, 1210*c*, and 1210*d* that form an array (see, e.g., FIGS. 9A-10B) to receive incident signal. Signals received by each antenna 1210*a* to 1210*d* are transmitted to a corresponding ADC 1220*a* to 1220*d* for sub-sampling. A compressed sensing processor 1230 collects the sub-sampled signals generated by the ADCs 1220*a* to 1220*d* to determine the frequencies of the spectral components in the incident signal. Clustering techniques implemented by the compressed sensing processor 1230 include k means techniques, Gaussian mixture models (GMMs), hierarchical clustering, and others. Clustering techniques can allow the system 1200 to achieve the same spectral sensing performance but using a smaller number of distinct sub-sampling frequencies, thereby reducing the number of ADCs and accordingly the cost of the system 1200.

Figure 13:
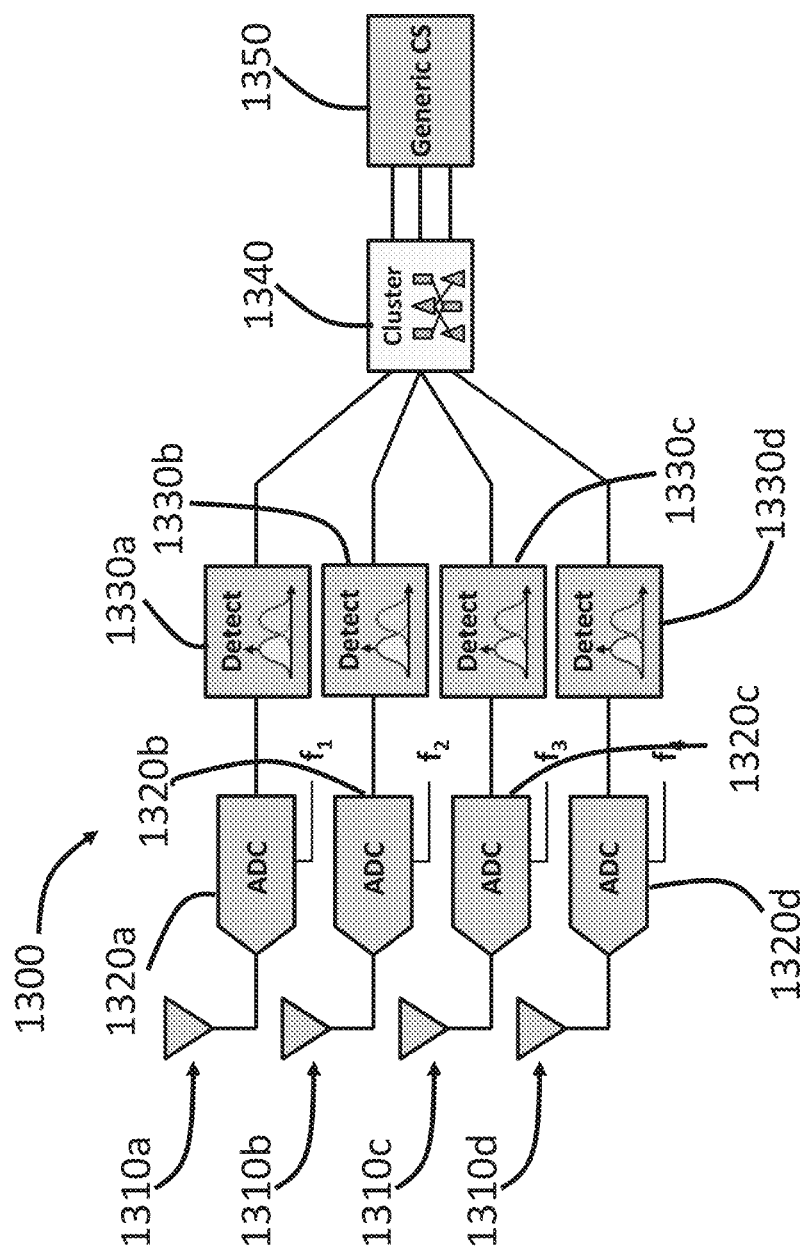
FIG. 13 shows a schematic of a spectral sensing system using clustering and generic CS techniques to compute spectral information.

FIG. 13 shows a schematic of a spectral sensing system 1300 including multiple detection channels to facilitate the implementation of clustering techniques. The system 1300 includes four antennas 1310*a*, 1310*b*, 1310*c*, and 1310*d* to receive incident signals. Each antenna 1310*a* to 1310*d* is connected to a corresponding ADC 1320*a* to 1320*d* to under-sample the received signals. Four detection channels 1330*a* to 1330*d* are connected to the four ADCs 1320*a* to 1320*d*, respectively, to detect (e.g., via FFT) and report detections of frequencies and associated features to a cluster processor 1340, which then divides the spectral sensing problem into several smaller detection problems based on, for example, the angle-of-arrival information. A compressed sensing processor 1350 solves the smaller detection problems to complete the spectral sensing.

Figure 14:
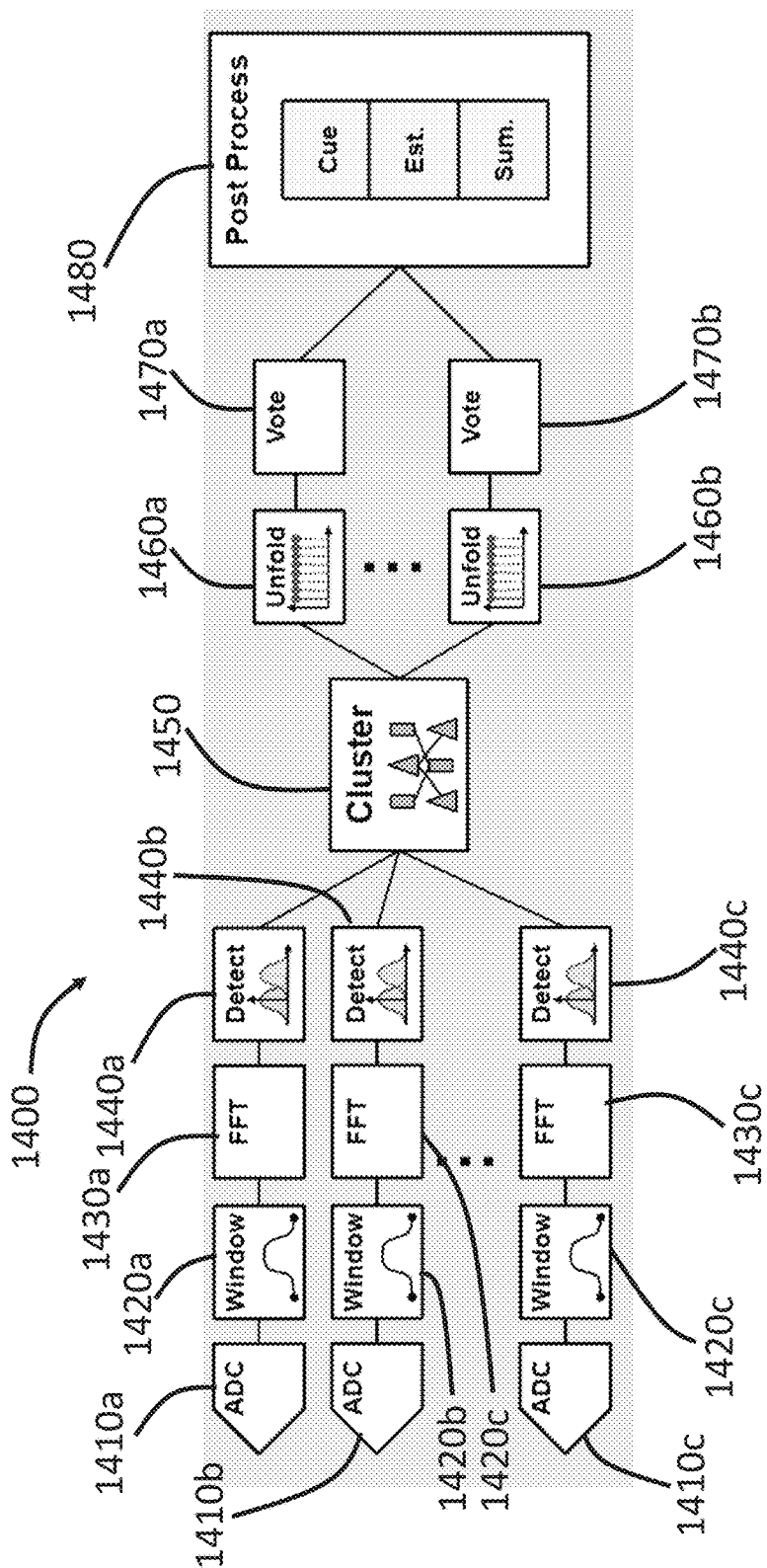
FIG. 14 shows a schematic of a spectral sensing system using clustering techniques before unfolding the detected frequencies.

FIG. 14 shows a schematic of a spectral sensing system 1400 that uses FFTs to detect frequencies and facilitate implementation of clustering techniques. The system 1400 includes multiple ADCs (three ADCs 1410*a*, 1410*b*, and 1410*c* are shown) to sub-sample received signals at different under-sampling frequencies. A window function (1420*a*, 1420*b*, or 1420*c*) is connected to each ADC 1410*a* to 1410*c* reduces discontinuities at the boundaries of the sub-sampled signals before an FFT processor 1430*a* to 1430*c* performs Fourier transforms and extracts frequencies. The Fourier transformed signals generated by the FFT processors 1430*a* to 1430*c* are transmitted to detection channels 1440*a* to 1440*c*, which report detections of frequencies and associated features to a cluster processor 1450. The cluster processor 1450 divides the spectral sensing problem into several smaller detection problems, each of which is sent to an unfolding processor 1460*a* or 1460*b* (two are shown for illustrative purposes) to unfold detected peaks to their possible frequencies bins. Voting processors 1470*a* and 1470*b* cast and collect votes in each frequency bin. A post processing system 1480 takes into account the information provided by the voting processors 1470*a* and 1470*b* to deliver the frequency, spatial, and/or time information of the incident signals.

Methods of Compressing Sensing Using Antenna Arrays

Figure 15:
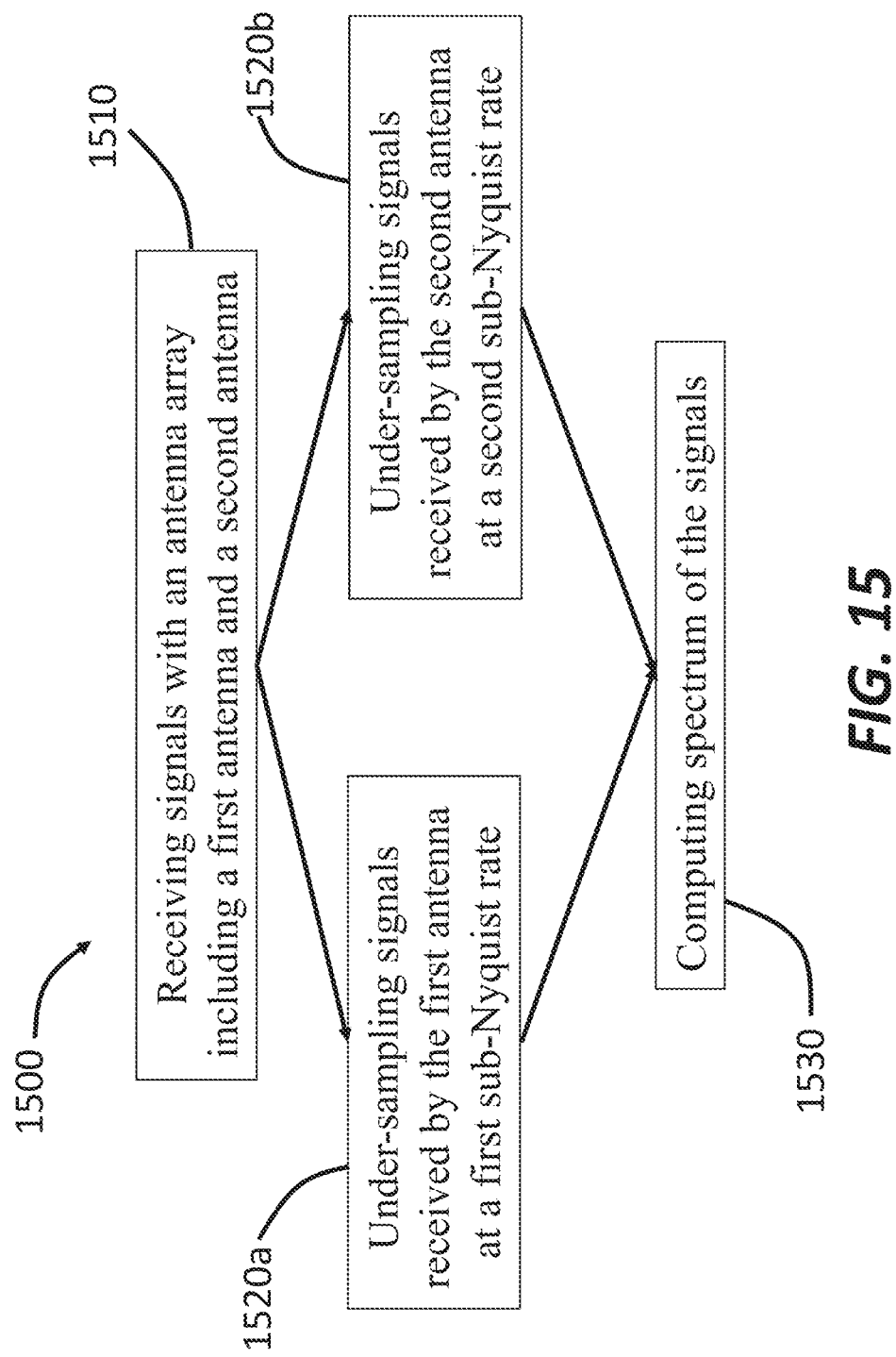
FIG. 15 illustrates a method of compressed sensing using an antenna array.

FIG. 15 illustrates a method 1500 of compressed sensing using antenna arrays. At step 1510 in the method 1500, incident signals are received by an antenna array including at least two antennas, namely, first antenna and second antenna. At step 1520*a*, signals received by the first antenna are under-sampled at a first sampling frequency $f_1$ below the Nyquist frequency $f_n$ of the incident signals to generate a first aliased signal. At step 1520*b*, signals received by the second antenna are under-sampled at a second sampling frequency $f_2$ below the Nyquist frequency $f_n$ of the incident signals to generate a second aliased signal. The two sampling frequencies $f_1$ and $f_2$ are usually different and can be related by co-prime downsampling factors. The two aliased signals generated at steps 1520*a* and 1520*b* are then processed together so as to compute the spectrum of the incident signals, as in step 1530. The processing can use methods such as sparse fast Fourier transform (sFFT) and other sparse Fourier transform algorithms, matching pursuit style algorithms, least absolute shrinkage and selection operator (LASSO) style algorithms including the elastic net, linear programming, second order cone programming, other compressed sensing (CS) detection and estimation algorithms, conventional and adaptive beamforming, and k means and other clustering algorithms, among others.

In one example, the incident signals can be received by an antenna array including sub-arrays (see, e.g., FIGS. 9A-9C), each of which is connected to an ADC for under-sampling at a distinct sampling frequency. In other words, signals received by antennas in one sub-array are sampled at the same sampling frequency. In another example, the incident signal can be received by an antenna array, in which each individual antenna is connected to an ADC for under-sampling, i.e., signals received by each antenna are sampled at a respective sampling frequency.

The method 1500 can include several additional steps to improve spectral sensing. In one example, the received signals can be down converted to an intermediary frequency or baseband before under-sampling. In another example, the method 1500 can include sampling and holding the incident signals (e.g. using sample-and-hold amplifiers) before under-sampling by ADCs. In yet another example, the received signals can be divided into in-phase components and quadrature components for separate under-sampling so as to extract more information from the received signals. In this example, the method 1500 can also include the optional step of digital IQ compensation to balance the amplitudes of the in-phase and the quadrature components. In yet another example, the method 1500 can utilize the spatial information in the signals received by the antenna array and carry out beamforming. In yet another example, the method 1500 can use clustering techniques to divide the overall spectral sensing problem into several smaller problems (e.g., based on the angle-of-arrival of received signals) so as to increase sensing efficiencies.

Simulation and Experimental Results of Array-Based Compressed Sensing

This section describes simulation and experimental results of array-based compressed sensing, demonstrating the good performance in estimating frequency and angle-of-arrival (AoA) information of the incident signals.

While it is possible to combine ACRA's time domain undersampling with undersampling in the spatial domain via a sparse array, a uniform linear array (ULA) can be used for simplicity. The simulation uses incident signals in the 32 GHz band between 18 and 50 GHz and ADCs operating between 1 and 2 GSPS. The simulated array spacing is 3 mm corresponding to λ/2 for 50 GHz. 8 unique sampling rates and 16 antenna elements are used. Each sampling rate is used twice with the assignments made by a random permutation. The simulation also uses 64-QAM OFDM signals with 12 subcarriers spaced 240 kHz apart so that the signals of interest are only approximately sparse in frequency. The subcarrier frequencies do not align with the DFT bins used in the sFFT reconstruction. Signals are collected at relatively high SNR (~28 dB per channel), but noise folding effects were included.

Figure 16A:
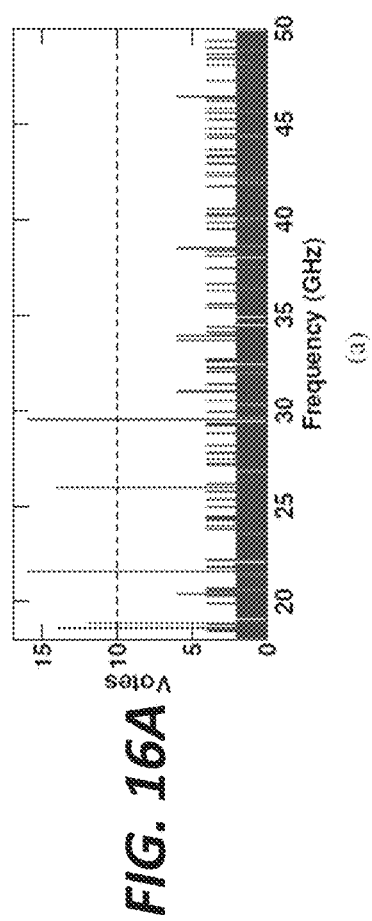
FIGS. 16A-16C show the results of simulating Array-based CS Receiver Architecture (ACRA) reception of 5 OFDM signals at different frequencies and angles of arrival.
Figure 16B:
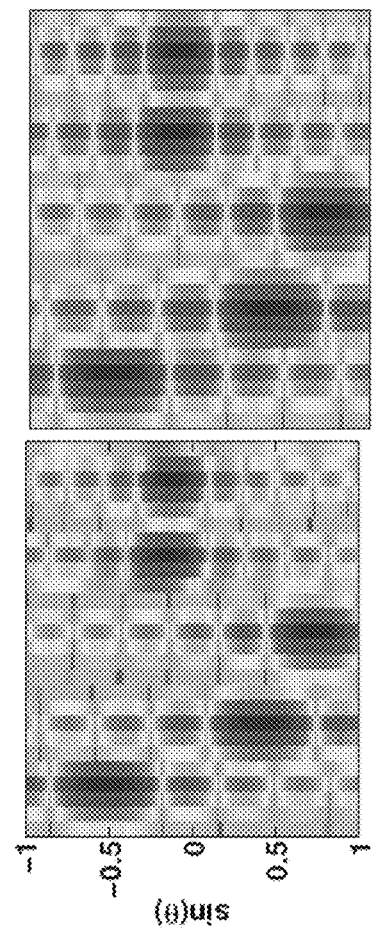
Figure 16C:

FIGS. 16A-16C show the results of simulating ACRA reception of 5 OFDM signals at different frequencies and angles of arrival. FIG. 16A shows that the sFFT voting step isolates frequencies agreed upon by at least 10 of 16 channels. Time domain signals are then synthesized at the Nyquist rate using the selected frequencies to build a basis. FIG. 16B shows the synthesized signals that are combined using a beamscan approach at the 26 frequency bins selected in FIG. 16A. FIG. 16C shows the beamscan result using Nyquist rate samples for comparison.

The 5 OFDM signals are of equal power centered at 18.63, 18.87, 21.58, 25.96, and 29.51 GHz with corresponding angles of arrival of −31.02, 24.31, 47.35, −8.60, and −6.95 degrees (sin θ=−0.52, 0.41, 0.74, −0.15, and −0.12, respectively). As shown in FIG. 16A, incoherent voting is employed to determine frequency bands with significant energy. Once these bands are determined, the time domain signals from each antenna can be synthesized at the Nyquist rate. These synthesized Nyquist signals can then be used in conventional beamforming approaches. The beamscan estimate is shown in FIG. 16B with each column corresponding to a different frequency bin detected by the sFFT. In this case, ACRA detects 26 frequency bins clustered into 5 groups. The signals are detected at the correct frequencies and at the correct AoA. For comparison, the beamscan results for signals collected at the Nyquist rate are shown in FIG. 16C, which agrees well with FIG. 16B.

Figure 16D:
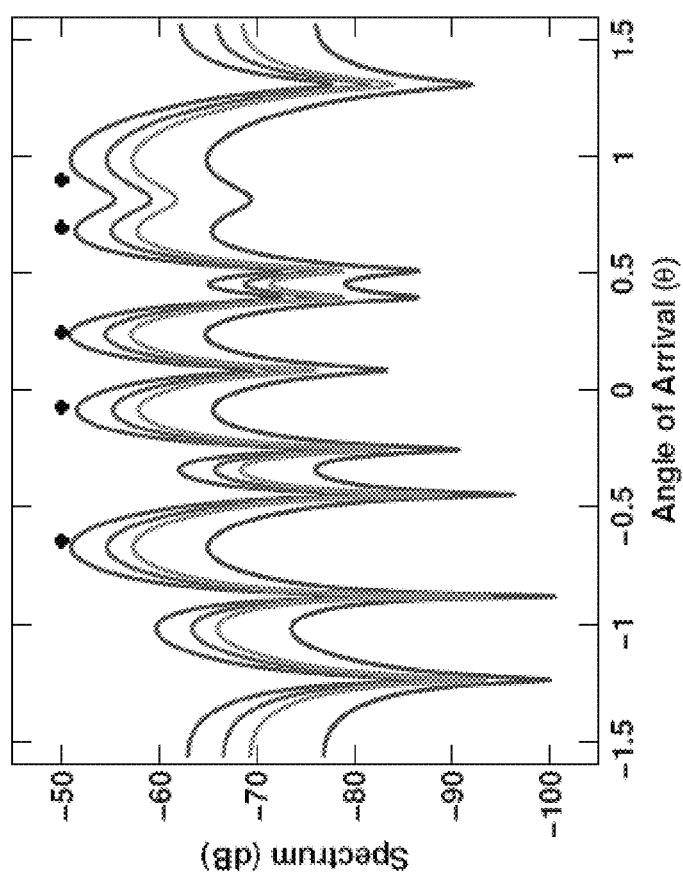
FIG. 16D is an ACRA beamscan power spectrum with 5 OFDM signals at the same frequency but at different angles of arrival.

FIG. 16D is an ACRA beamscan spectrum when 5 OFDM signals lie in the same frequency but at different angles of arrival. Solid lines represent spatial spectra for four neighboring frequency bins with detected energy. Black dots illustrate true angles of arrival (at an arbitrary power level). As can be sees from FIG. 16D, ACRA correctly selects four frequency bins surrounding the common carrier frequency. The traces are nearly identical to those of the Nyquist rate beamscan (not shown).

As described above, some minor hardware modifications may be helpful to convert a typical tuned array to an ACRA array. An 18-45 GHz testbed can be constructed using discrete commercial off-the-shelf (COTS) RF components to verify feasibility of the approach. The testbed comprises 8 channels capable of operating at 4 different sampling rates up to 2 GSPS. One challenge in the testbed is to extend the ADC input bandwidth to span several Nyquist zones. Most COTS ADCs are designed to be used with an anti-alias filter; thus, their internal track-and-hold circuits are not designed for bandwidths many times the maximum sampling rate. The testbed uses 2 GSPS ADCs (e.g., SP Devices, ADQ412-4GcPCIe/PXIe) with data sheet input bandwidth of 2 GHz. THA evaluation boards (e.g., Hittite, EVAL01-HMC661LC4B) are used in front of the ADCs to increase the input bandwidth to 18 GHz. IQ sampling can be used to increase the input bandwidth beyond the 18 GHz provided by the THAs. However, frequency dependent mismatches in the I and Q paths of the receivers may cause images to appear in the sampled signal. Marki MLIQ-1845L IQ mixers can be used in the testbed to maximize the image rejection ratio (IRR) while allowing an input band of 18-45 GHz. Mismatches in the filters, THAs, ADCs, and cables that follow the mixers can increase IRR. Digital compensation then can be used to address IQ mismatch in the receiver chains of each channel.

Figure 17A:
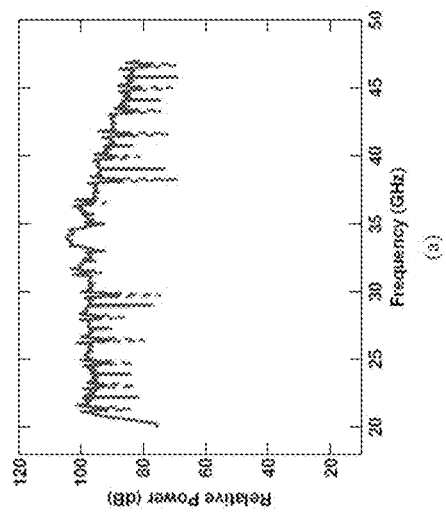
FIGS. 17A-17B show digital IQ compensation in a single ACRA channel.
Figure 17B:
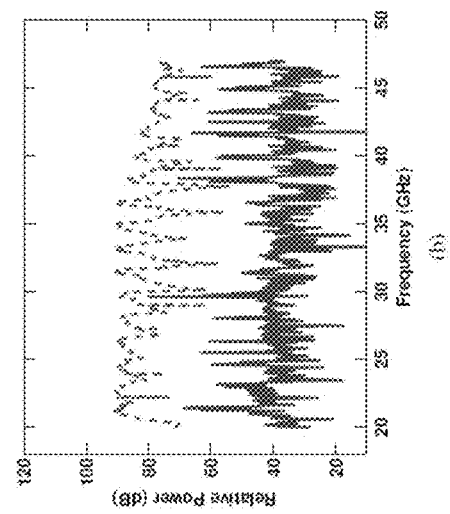

FIGS. 17A-17B show digital IQ compensation in a single ACRA channel. Dashed lines show power before calibration, while solid lines show power after calibration for tones (FIG. 17A) and images (FIG. 17B). Looking across all channels, an average IRR of 40.6 dB is obtained.

Digital IQ compensation applies amplitude and phase adjustments to the Q channel which depend on the frequency of the input signal. Using ACRA, the frequency of a signal in a single channel is ambiguous by design, making it uncertain to determine which IQ compensation adjustments to apply. Slight modifications to accommodate IQ compensation can be made.

First, when detecting large magnitude signals in the downsampled spectra, rather than use the magnitude of the coefficient in a given downsampled DFT bin, the sum of the absolute values of the frequency domain I and Q channel signals can be used. This can reduce the chance of missing a detection due to IQ mismatch.

Second, when unfolding each detected signal to its possible source frequencies bins, the IQ adjustments can be applied corresponding to each possible source frequency to check if the signal magnitude still exceeds the threshold.

Figure 18A:
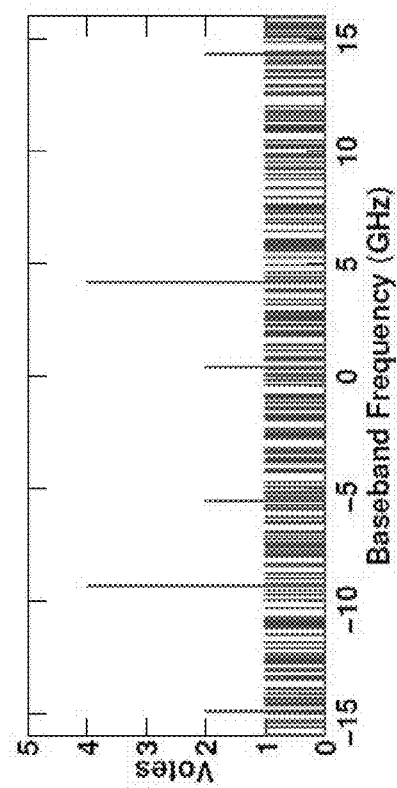
FIGS. 18A-18B show tone detection on an ACRA testbed with digital IQ compensation.
Figure 18B:
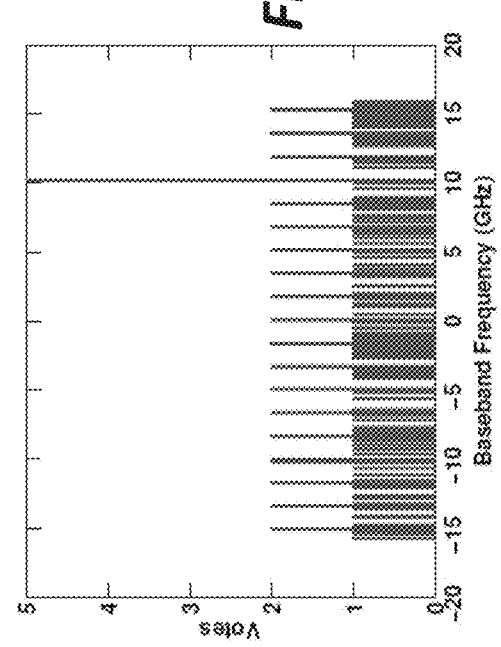

FIGS. 18A-18B show successful tone detection on the ACRA testbed with suppression of images via digital IQ compensation. In FIG. 18A, the tones are generated at 24.7 and 38.2 GHz and applied to 4 channels of the testbed. The signals are mixed to baseband with a 34 GHz LO in each channel and subsequently sampled at 1.3913, 1.5238, 1.6842, and 1.8824 GSPS. sFFT processing is applied with digital IQ compensation to detect the two signals at the appropriate frequencies. FIG. 19B shows image-free detection of a tone at 44.2 GHz.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of designing and making the technology disclosed herein may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes (outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or"

should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An apparatus for sensing an incident signal, the apparatus comprising:
   an antenna array to receive the incident signal, the antenna array comprising a first antenna and a second antenna;
   a first analog-to-digital converter (ADC), communicatively coupled to the first antenna, to generate a first aliased signal by sampling the incident signal at a first sampling frequency $f_1$ below a Nyquist frequency $f_n$ of the incident signal;
   a second ADC, communicatively coupled to the second antenna, to generate a second aliased signal by sampling the incident signal at a second sampling frequency $f_2$, different than the first sampling frequency $f_1$, below the Nyquist frequency $f_n$ of the incident signal; and
   a processing system, communicatively coupled to the first ADC and the second ADC, to compute a spectrum of the incident signal based at least in part on the first aliased signal and the second aliased signal.

2. The apparatus of claim 1, wherein the antenna array comprises a sparse array.

3. The apparatus of claim 1, wherein the antenna array comprises:
   a first sub-array of antennas operably coupled to the first ADC, the first sub-array of antennas comprising the first antenna and at least a third antenna; and
   a second sub-array of antennas operably coupled to the second ADC, the second sub-array of antenna comprising the second antenna and at least a fourth antenna.

4. The apparatus of claim 1, wherein a ratio of the first sampling frequency $f_1$ to the second sampling frequency $f_1$ is substantially equal to or greater than 2.

5. The apparatus of claim 1, wherein the first sampling frequency $f_1$ is $f_n/p_1$, the second sampling frequency $f_2$ is $f_n/p_2$, and $p_1$ and $p_2$ are co-prime numbers.

6. The apparatus of claim 5, wherein at least one of $p_1$ and $p_2$ is greater than a ratio of a total bandwidth of the incident signal to a sampling rate of at least one of the first ADC and the second ADC.

7. The apparatus of claim 5, wherein at least one of $p_1$ and $p_2$ is greater than 15.

8. The apparatus of claim 1, wherein the processing system is configured to:
   generate a first spectral-domain signal from the first aliased signal, the first spectral-domain signal having a first spectral-domain folding of the incident signal;
   generate a second spectral-domain signal from the second aliased signal, the second spectral-domain signal having a second spectral-domain folding of the incident signal different than the first spectral-domain folding; and
   compute the spectrum of the incident signal based at least in part on the first spectral-domain signal and the second spectral-domain signal.

9. The apparatus of claim 8, wherein the processing system is further configured to compute the spectrum of the incident signal by combining the first spectral-domain signal and the second spectral-domain signal based on the first sampling frequency $f_1$ and the second sampling frequency $f_2$.

10. The apparatus of claim 8, further comprising:
    a beamformer, operably coupled to the processing system, to perform beamforming based at least in part on the spectrum of the incident signal.

11. The apparatus of claim 1, wherein the processing system is further configured to determine an angle-of-arrival of the incident signal based on the spectrum of the incident signal.

12. The apparatus of claim 1, wherein the processing system is configured to determine the spectrum of the incident signal by performing a first Discrete Fourier Transform (DFT) on the first aliased signal and a second DFT on the second aliased signal.

13. The apparatus of claim 1, further comprising:
a first downconverter, communicatively coupled between the first antenna and the first ADC, to down convert the incident signal; and
a second downconverter, communicatively coupled between the second antenna and the second ADC, to down convert the incident signal.

14. The apparatus of claim 1, further comprising:
a first track-and-hold amplifier (THA), disposed between the first antenna and the first ADC, to increase a first input bandwidth of the first ADC; and
a second THA, disposed between the second antenna and the second ADC, to increase a second input bandwidth of the second ADC.

15. The apparatus of claim 1, further comprising:
a beamformer, operably coupled to the first ADC and the second ADC, to calculate a first complex weight $w_1$ for the first aliased signal and a second complex weight $w_2$ for the second aliased signal so as to perform beamforming.

16. A method for sensing an incident signal, the method comprising:
receiving the incident signal with an antenna array comprising a first antenna and a second antenna;
sampling the incident signal received by the first antenna at a first sampling frequency $f_1$ below a Nyquist frequency $f_n$ of the incident signal to generate a first aliased signal;
sampling the incident signal received by the second antenna at a second sampling frequency $f_2$, different than the first sampling frequency $f_1$, below the Nyquist frequency $f_n$ of the incident signal to generate a second aliased signal; and
computing a spectrum of the incident signal based at least in part on the first aliased signal and the second aliased signal.

17. The method of claim 16, wherein receiving the incident signal comprises receiving the incident signal using a sparse array.

18. The method of claim 16, wherein receiving the incident signal comprises:
receiving the incident signal using a first sub-array of antennas operably coupled to the first ADC, the first sub-array of antennas comprising the first antenna and at least a third antenna; and
receiving the incident signal using a second sub-array of antennas operably coupled to the second ADC, the second sub-array of antenna comprising the second antenna and at least a fourth antenna.

19. The method of claim 16, wherein sampling the incident signal comprises sampling the incident signal received by the first antenna at the first sampling frequency $f_1$ at least two times greater than the second sampling frequency $f_2$.

20. The method of claim 16, wherein sampling the incident signal comprises:
sampling the incident signal received by the first antenna at the first sampling frequency $f_1$ substantially equal to $f_n/p_1$; and
sampling the incident signal received by the second antenna at the second sampling frequency $f_2$ substantially equal to $f_n/p_2$,
wherein $p_1$ and $p_2$ are co-prime numbers.

21. The method of claim 20, wherein at least one of $p_1$ and $p_2$ is greater than 15.

22. The method of claim 16, wherein computing the spectrum of the incident signal comprises:
generating a spectral-domain signal from the first aliased signal, the first spectral-domain signal having a first spectral-domain folding of the incident signal;
generating a second spectral-domain signal from the second aliased signal, the second spectral-domain signal having a second spectral-domain folding of the incident signal; and
computing the spectrum of the incident signal based at least in part on the first spectral-domain signal and the second spectral-domain signal.

23. The method of claim 22, wherein computing the spectrum of the incident signal comprises combining the first spectral-domain signal and the second spectral-domain signal based on the first sampling frequency $f_1$ and the second sampling frequency $f_2$.

24. The method of claim 22, wherein computing the spectrum of the incident signal comprises performing a first Discrete Fourier Transform (DFT) on the first aliased signal and a second DFT on the second aliased signal.

25. The method of claim 22, further comprising:
performing beamforming based at least in part on the spectrum of the incident signal.

26. The method of claim 16, further comprising:
determining an angle-of-arrival of the incident signal.

27. The method of claim 16, further comprising:
down-converting the incident signal received by the first antenna before sampling; and
down-converting the incident signal received by the second antenna before sampling.

28. The method of claim 16, further comprising:
transmitting the incident signal received by the first antenna through a first track-and-hold amplifier (THA) before sampling; and
transmitting the incident signal received by the second antenna thorough a second THA before sampling.

29. The method of claim 16, further comprising:
calculating a first complex weight $w_1$ for the first aliased signal and a second complex weight $w_2$ for the second aliased signal so as to perform beamforming.

30. An apparatus for sensing an incident signal, (Original) The apparatus comprising:
a first sensing channel comprising:
a first antenna to receive the incident signal;
a first in-phase channel, operably coupled to the first antenna, to receive a first in-phase component of the incident signal, the first in-phase channel comprising a first in-phase analog-to-digital converter (ADC) to sample the first in-phase component at a first sampling frequency $f_1$ below a Nyquist frequency $f_n$ of the incident signal to generate a first sampled in-phase signal; and
a first quadrature channel, operably coupled to the first antenna, to receive a first quadrature component of the incident signal, the first quadrature channel comprising a first quadrature ADC to sample the first quadrature component at the first sampling frequency $f_1$ to generate a first sampled quadrature signal; and
a second sensing channel comprising:
a second antenna to receive the incident signal;
a second in-phase channel, operably coupled to the second antenna, to receive a second in-phase component of the incident signal, the second in-phase channel comprising a second in-phase ADC to sample the second in-phase component at a second sampling frequency $f_2$ below the Nyquist frequency $f_n$ of the incident signal to generate a second sampled in-phase signal;

a second quadrature channel operably coupled to the second antenna to receive a second quadrature component of the incident signal, the second quadrature channel comprising a second quadrature ADC to sample the second quadrature component at the second sampling frequency $f_2$ to generate a second sampled quadrature signal; and a processing system, communicatively coupled to the first sensing channel and the second sensing channel, to compute frequency information and direction information of the incident signal based at least in part on the first sampled in-phase signal, the first sampled quadrature signal, the second sampled in-phase signal, and the second sampled quadrature signal.

31. The apparatus of claim 30, further comprises:

a first digital IQ compensator, operably coupled to the first in-phase ADC and the first quadrature ADC, to mitigate IQ mismatch in the first sensing channel and generate a first compensated signal; and a second digital IQ compensator, operably coupled to the second in-phase ADC and the second quadrature ADC, to mitigate IQ mismatch in the second sensing channel and generate a second compensated signal, wherein the processing system computes the frequency information and direction information based at least in part on the first compensated signal and the second compensated signal.

32. A method for sensing an incident signal, (Original) The method comprising:

receiving the incident signal with an antenna array comprising a first antenna and a second antenna;

sampling the incident signal received by the first antenna at a first sampling frequency $f_1$ below a Nyquist frequency $f_n$ of the incident signal to generate a first aliased signal;

sampling the incident signal received by the second antenna at a second sampling frequency $f_2$ below the Nyquist frequency $f_n$ of the incident signal to generate a second aliased signal, the second sampling frequency $f_2$ being relatively prime with respect to the first sampling frequency $f_1$;

generating a first spectral-domain signal from the first aliased signal, the first spectral-domain signal having a first spectral-domain folding of the incident signal;

generating a second spectral-domain signal from the second aliased signal, the second spectral-domain signal having a second spectral-domain folding of the incident signal different than the first spectral-domain folding;

combining the first spectral-domain signal and the second spectral-domain signal based on the first sampling frequency $f_1$ and the second sampling frequency $f_2$ to form a spectrum of the incident signal; and determining a direction-of-arrival of the incident signal based on the spectrum of the incident signal.

* * * * *

UNITED STATES PATENT AND TRADEMARK OFFICE
CERTIFICATE OF CORRECTION

PATENT NO. : 10,367,674 B2
APPLICATION NO. : 15/811905
DATED : July 30, 2019
INVENTOR(S) : Bolstad et al.

Page 1 of 1

It is certified that error appears in the above-identified patent and that said Letters Patent is hereby corrected as shown below:

In the Claims

- Column 22, In Claim 4, Line 28, replace "frequency $f_1$ to the second sampling frequency $f_1$" with -- frequency $f_1$ to the second sampling frequency $f_2$ --.

Signed and Sealed this
Seventeenth Day of September, 2019

Andrei Iancu
*Director of the United States Patent and Trademark Office*